United States Patent
Watanabe et al.

[11] Patent Number: 6,057,580
[45] Date of Patent: *May 2, 2000

[54] SEMICONDUCTOR MEMORY DEVICE HAVING SHALLOW TRENCH ISOLATION STRUCTURE

[75] Inventors: Hiroshi Watanabe, Yokohama; Yuji Takeuchi, Kawasaki; Kazuhiro Shimizu; Seiichi Aritome, both of Yokohama, all of Japan

[73] Assignee: Kabushiki Kaisha Toshiba, Kawasaki, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 09/111,489

[22] Filed: Jul. 7, 1998

[30] Foreign Application Priority Data

Jul. 8, 1997 [JP] Japan .................................... 9-182479

[51] Int. Cl.[7] .................................................. H01L 31/119
[52] U.S. Cl. .......................... 257/396; 257/397; 257/513
[58] Field of Search ................................... 257/314, 315, 257/316, 396, 397, 398, 399, 506, 510, 513, 390, 391, 394; 438/257, 211, 218, 221, 424, 435

[56] References Cited

U.S. PATENT DOCUMENTS

| | | | |
|---|---|---|---|
| 5,064,683 | 11/1991 | Poon et al. | 451/29 |
| 5,436,488 | 7/1995 | Poon et al. | 257/513 |
| 5,455,438 | 10/1995 | Hashimoto et al. | 257/510 |
| 5,646,888 | 7/1997 | Mori | 257/315 |

FOREIGN PATENT DOCUMENTS 8125148  5/1996  Japan ............................ H01L 27/115

*Primary Examiner*—Sara Crane
*Attorney, Agent, or Firm*—Loeb & Loeb, LLP

[57] ABSTRACT

In a nonvolatile semiconductor memory device, those sides of the gate insulating film and the floating gate electrode which oppose an inner side of a trench are oxidized to form an oxide film. The gate insulating film, the floating gate electrode, and that portion of semiconductor substrate which is near the gate insulating film oppose an insulator made of a first material buried in the trench via another insulator made of a second material difference from the first material buried in the trench. The first material has a low diffusability of impurities, and is, for example, silicon nitride, which effectively suppresses diffusion of impurities from the second material into the gate insulating film.

19 Claims, 16 Drawing Sheets

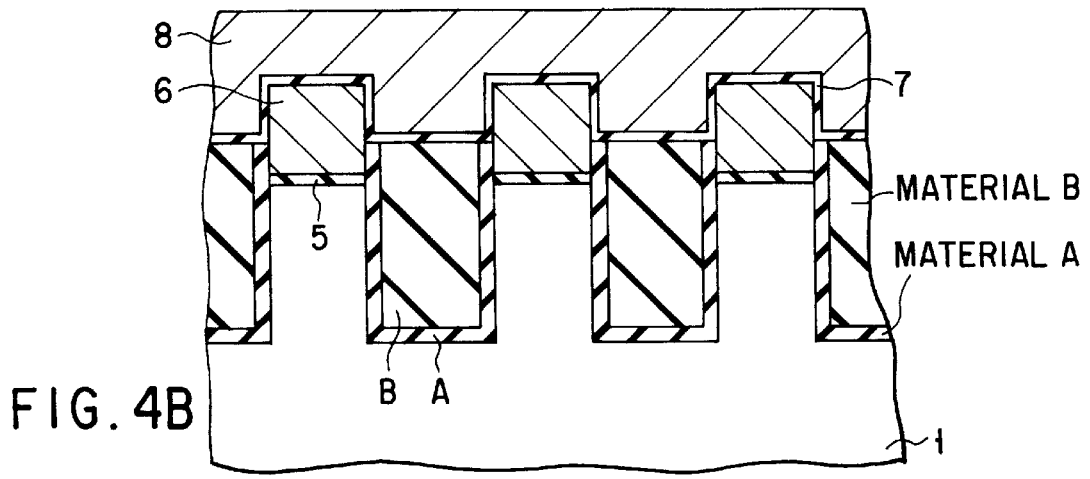
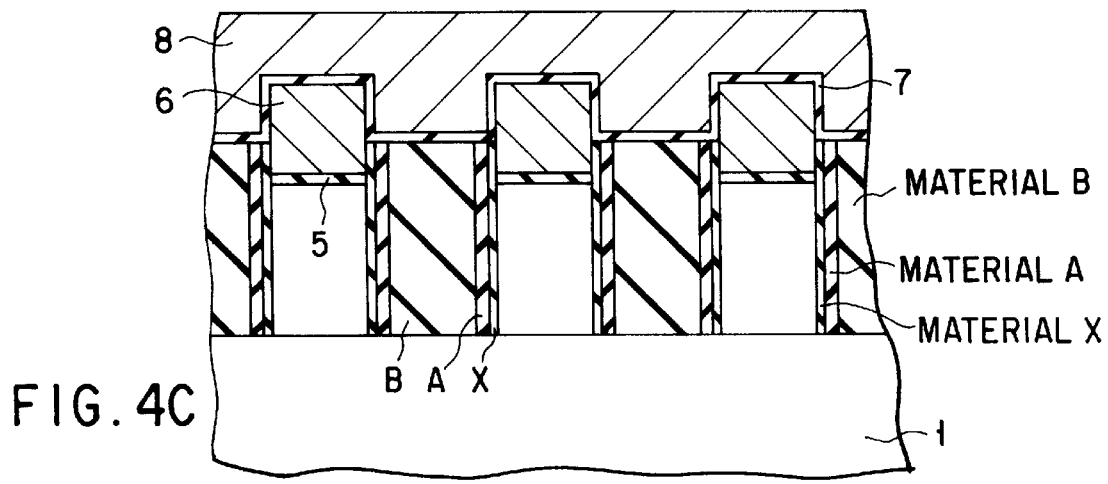
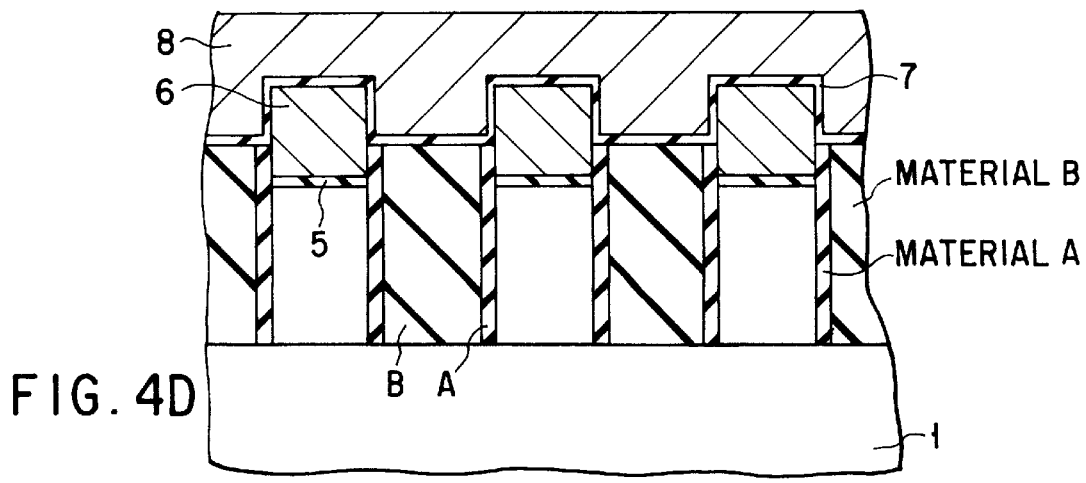

SEMICONDUCTOR MEMORY DEVICE HAVING SHALLOW TRENCH ISOLATION STRUCTURE

BACKGROUND OF THE INVENTION

The present invention relates to a semiconductor device in which is buried an element-isolating structure and also to a method of manufacturing the semiconductor device.

FIG. 39 is a sectional view showing the memory cells of a nonvolatile semiconductor memory having a conventional buried element-isolating structure. Trenches 902 are made in the upper surface of a silicon substrate 901. Each trench 902 is filled with an insulator 903. The insulators 903 constitute an element-isolating structure.

Thin oxide films 904 called "tunnel insulating film" are formed on the silicon substrate 901. Floating-gate electrodes 905 are formed on the films 904 (hereinafter referred to as "tunnel oxide film"). A $SiO_2/Si_3N_4/SiO_2$ (ONO) film 906 is provided, covering the insulators 903 and the floating-gate electrodes 905. A control-gate electrode 907 is formed on the ONO film 906. The insulators 903 are buried in the trenches 902, with their upper parts contacting the sides of the floating-gate electrodes 905.

The insulator 903 is made of a silicon oxide-based material such as TEOS (tetraethoxysilane) or BPSG (borophosphosilicate glass). The buried insulator 903 made of silicon oxide-based material directly contacts the silicon substrate, or contact a silicon oxide film formed by oxidizing the surface of the substrate. The buried insulators 903 also contact the sides of the tunnel oxide film 904 and the sides of the floating-gate electrodes 905 made of polysilicon.

The method of manufacturing the memory cells isolated by the conventional element-isolating structure described above will be explained, with reference to FIGS. 40A to 40E.

First, as shown in FIG. 40A, the surface of a p-type silicon substrate 901 is oxidized, forming an oxide film 911. Ion implantation is performed, thereby forming well regions and channel regions in the substrate 901. The oxide film 911 is removed, and gate insulating films of peripheral circuits and a tunnel oxide film 904 are formed. A polysilicon layer 905 is deposited on the tunnel oxide film 904. Further, a silicon nitride film 912 is deposited on the polysilicon layer 905. A resist (not shown) is coated on the silicon nitride film 912 and subsequently processed, forming a resist pattern. Using the resist pattern as mask, the silicon nitride film 912, polysilicon film 905 and tunnel oxide film 904 are etched, exposing parts of the silicon substrate 901. The parts of the substrate 901, thus exposed, are etched, thereby forming trenches 902 in the substrate 901, as is illustrated in FIG. 40B. Then, the resist pattern (not shown) is removed from the resultant structure.

As shown in FIG. 40C, the inner surfaces of each trench 902 are oxidized, forming an oxide film 913. Silicon oxide, for example TEOS, is deposited on the substrate 901, filling the trenches 902 and covering the silicon nitride film 912.

Next, as shown in FIG. 40D, CMP (chemical mechanical polishing) is performed on the silicon oxide film, until the silicon nitride film 912 is exposed. Insulators 903 made of silicon oxide are thereby formed, each filling one trench 902 and having a flat top.

As shown in FIG. 40E, the silicon nitride film 912 used as a mask is removed, whereby an element-isolating structure is formed. An ONO film is deposited on the upper surface of the semiconductor structure. A polysilicon layer is deposited on the ONO film. The polysilicon layer is then patterned, forming control electrodes. Thus, memory cells are manufactured.

Each insulator 903 made of silicon oxide and filling one trench 902 directly contacts the tunnel oxide films 904 and the gate electrodes 905. Alternatively, the insulator 903 contacts the oxide film 913 which has been formed by thermally oxidizing the silicon substrate 901 and polysilicon film 905 and which contacts the substrate 901, the tunnel oxide film 904 and the gate electrodes 905. Anyway, each insulator 903 made of a silicon oxide-based material extends from the bottom of one trench 902 from the top thereof. With the structure, the impurities in the buried insulators 903, such as hydrogen and metal, may easily diffuse into the tunnel oxide films 904 and the interface between each tunnel oxide film 904 and the gate electrode 905. The diffused impurities may impair the operating efficiency of the transistors and memory cells incorporated in the nonvolatile semiconductor memory.

The impurities may diffuse from the buried insulators 903 into the surface regions of the silicon substrate 901, and in this case, the impurities impair the junction-leak characteristic of the diffusion layers of the transistors and memory cells. If the junction-leak characteristic is impaired, the memory cells will be deteriorated in terms of operating efficiency.

BRIEF SUMMARY OF THE INVENTION

The present invention has been made in view of the above. Its object is to provide an element-isolating structure which reduces the diffusion of impurities into the gate insulating film (i.e., tunnel oxide film in a nonvolatile semiconductor memory), the gate electrodes and the near-element parts of the silicon substrate.

According to an aspect of the present invention, there is provided a semiconductor device which comprises: a semiconductor substrate; a gate insulating film provided on the semiconductor substrate; a gate electrode provided on the gate insulating film; a trench, adjacent to the gate insulating film and the gate electrode, provided in the semiconductor substrate; and a plurality of element-isolating insulators buried in the trench, in which one of the element-isolating insulators corresponding to a portion of the trench adjacent to the gate insulating film, an interface between the gate insulating film and the gate electrode, and an interface between the gate insulating film and the semiconductor substrate, is made of a material different from that of the element-isolating insulator which is provided in another portion of the trench.

In the semiconductor device according to the aspect of the present invention, the semiconductor substrate is a silicon substrate, a thermal oxide film is provided on the silicon substrate, and the gate electrode, and one of the element-isolating insulators constitutes a first material insulator made of a first material and opposes via the thermal oxide film at least a surface of the trench adjacent to the gate insulating film and another one of the element-isolating insulators constitutes a second material insulator made of a second material different from the first material and is provided in another portion of the trench.

In the semiconductor device according to the aspect of the present invention, the first material insulator indirectly contacts the entire surface of the trench via the thermal oxide film, and the second material insulator opposes the semiconductor substrate via the first material insulator.

In the semiconductor device according to the aspect of the present invention, the first material insulator indirectly contacts the gate insulating film and a surface of the gate electrode and the substrate which are near the gate insulating film via the thermal oxide film, and the second material insulator opposes the gate insulating film and the gate electrode via at least the first material insulator.

In the semiconductor device according to the aspect of the present invention, the second material insulator is located at a lower part of the trench, and the first material insulator is located at an upper part of the trench and opposes the gate insulating film.

In the semiconductor device according to the aspect of the present invention, the first material insulator is resistant to oxidation.

In the semiconductor device according to the aspect of the present invention, the first material insulator is a barrier material to impurities existing in the second material insulator.

In the semiconductor device according to the aspect of the present invention, the first material insulator is silicon nitride and the second material insulator is silicon oxide.

In the semiconductor device according to the aspect of the present invention, the first material insulator is oxynitride, and the second material insulator is silicon oxide.

In the semiconductor device according to the aspect of the present invention, the semiconductor substrate is a silicon substrate, a thermal oxide film is provided on the silicon substrate, and the gate electrode, and one of the element-isolating insulators constitutes a first material insulator made of a first material and opposes via the thermal oxide film at least a surface of the trench adjacent to the silicon substrate and another one of the element-isolating insulators constitutes a second material insulator made of a second material different from the first material and is provided in the central portion of the trench.

According to another aspect of the present invention, there is provided a semiconductor device which comprises: a semiconductor substrate; a plurality of trenches made in the semiconductor substrate; an array including a plurality of elements, each of the elements including a gate insulating film and a gate electrode provided on that portions of the semiconductor substrate which are located among the trenches; and a plurality of element-isolating insulators buried in each of the trenches, in which one of the element-isolating insulators corresponding to a portion of the trench adjacent to the gate insulating film, an interface between the gate insulating film and the gate electrode, and an interface between the gate insulating film and the semiconductor substrate, is made of a material different from that of the element-isolating insulator which is provided in another portion of the trench.

In the semiconductor device according to the aspect of the present invention, the semiconductor substrate is a silicon substrate, a thermal oxide film is provided on the silicon substrate, and the gate electrode, and one of the element-isolating insulators constitutes a first material insulator made of a first material and opposes via the thermal oxide film at least a surface of the trench adjacent to the gate insulating film and another one of the element-isolating insulators constitutes a second material insulator made of a second material different from the first material and is provided in another portion of the trench.

In the semiconductor device according to the aspect of the present invention, the first material insulator indirectly contacts the entire surface of the trench via the thermal oxide film, and the second material insulator opposes the semiconductor substrate via the first material insulator.

In the semiconductor device according to the aspect of the present invention, the first material insulator indirectly contacts the gate insulating film and a surface of the gate electrode and the substrate which are near the gate insulating film via the thermal oxide film, and the second material insulator opposes the gate insulating film and the gate electrode via at least the first material insulator.

In the semiconductor device according to the aspect of the present invention, the second material insulator is located at a lower part of the trench, and the first material insulator is located at an upper part of the trench and opposes the gate insulating film.

In the semiconductor device according to the aspect of the present invention, the first material insulator is resistant to oxidation.

In the semiconductor device according to the aspect of the present invention, the first material insulator is a barrier material to impurities existing in the second material insulator.

In the semiconductor device according to the aspect of the present invention, the first material insulator is silicon nitride and the second material insulator is silicon oxide.

In the semiconductor device according to the aspect of the present invention, the first material insulator is oxynitride, and the second material insulator is silicon oxide.

In the semiconductor device according to the aspect of the present invention, the semiconductor substrate is a silicon substrate, a thermal oxide film is provided on the silicon substrate, and the gate electrode, and one of the element-isolating insulators constitutes a first material insulator made of a first material and opposes via the thermal oxide film at least a surface of the trench adjacent to the silicon substrate and another one of the element-isolating insulators constitutes a second material insulator made of a second material different from the first material and is provided in the central portion of the trench, In the semiconductor device according to the aspect of the present invention, the array of elements is an array of memory cells of a nonvolatile semiconductor memory, and the gate electrode is a floating gate electrode of the nonvolatile semiconductor memory.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 4B is a sectional view of another version of the NAND-type EPROM shown in FIG. 4A;

FIG. 4C is a sectional view of another version of the NAND-type EPROM shown in FIG. 4A;

FIG. 4D is a sectional view of another version of the NAND-type EPROM shown in FIG. 4A;

DETAILED DESCRIPTION OF THE INVENTION

NAND-type EEPROMs according to the invention, particularly the memory cells thereof, will be described with reference to the accompanying drawings.

Figure 1A:
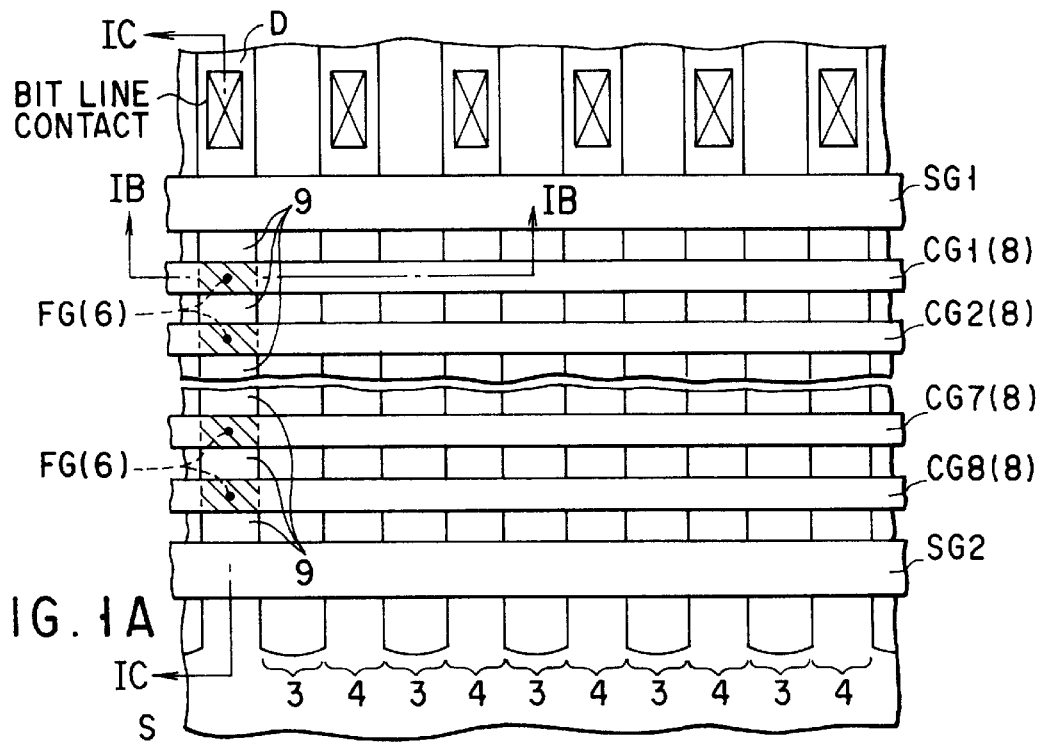
FIG. 1A is a plan view of a NAND-type EEPROM according to a first embodiment of this invention.

A NAND-type EEPROM, which is the first embodiment of the invention, will be described with reference to FIGS. 1A to 1C and FIGS. 2 and 3. FIG. 1A is a plan view of the NAND-type EEPROM, FIG. 1B is a sectional view taken along line IB—IB in FIG. 1A, and FIG. 1C is a sectional view taken along line IC—IC in FIG. 1A.

As shown in FIG. 1A, element regions 4 are formed in the surface of a silicon substrate 1 and isolated from one another by trench isolations 3. The regions 4 are memory cell regions provided in the form of strips. In the surface of each element region 4, a source diffusion layer 9 and a drain diffusion layer 9 are formed, spaced apart from each other. A channel region is provided between the drain and source diffusion layers 9.

Figure 1B:
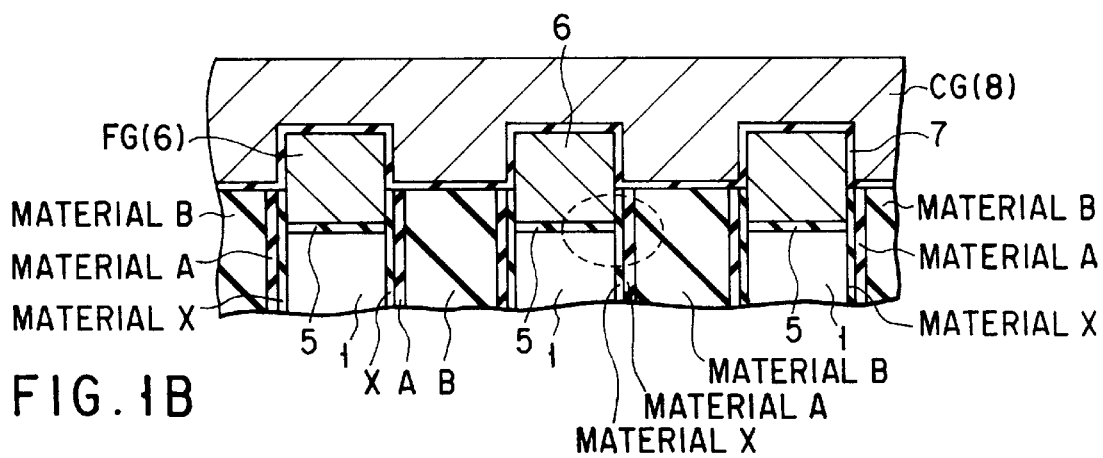
FIG. 1B is a sectional view taken along line IB—IB shown in FIG. 1A.

As shown in FIG. 1B, gate insulating films 5 (i.e., tunnel insulating films) are provided on the channel regions 9, respectively. Conductor layers 6 are provided on the gate insulating films 5, serving as floating gate electrodes FG. An inter-layer insulating film 7 is formed, covering the floating gate electrodes FG (i.e., layers 6). Conductor layers 8 serving as control gate electrodes CG are provided on the inter-layer insulating film 7. As shown in FIG. 1A, the control gate electrodes CG (i.e., layers 8) extend parallel to one another and at right angles to the element regions 4.

Figure 1C:
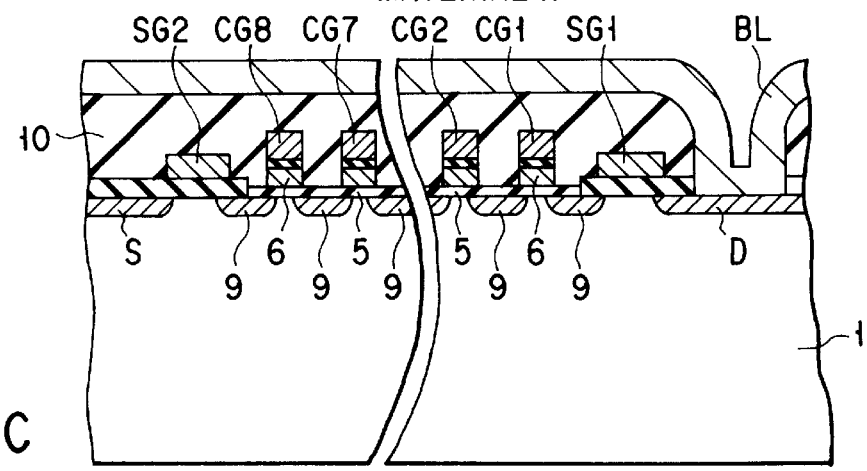
FIG. 1C is a sectional view taken along line IC and IC shown in FIG. 1A.

In the first embodiment shown in FIGS. 1A to 1C, eight memory cells having floating gates FG which intersect with the eight control gate electrodes CG1 to CG8 constitute one memory-cell unit. As shown in FIG. 1C, the memory-cell unit is connected at one end to a drain D (a bit-line contact) by a selection gate SG1, and at the other end to a source line S by a selection gate SG2. Both the bit-line contact D and the bit line BL extending through a contact hole made in an inter-layer insulating film 10 and thus connected to the bit-line contact D are shown in FIG. 1C. In FIG. 1A, only the bit-line contact D is illustrated.

The basic structure of the NAND-type EEPROM, which is the first embodiment, will be described with reference to FIG. 1B. The gate insulating films 5 are provided on the silicon substrate 1. The films 5 had been formed before the trenches 3 were made in the surface of the silicon substrate 1. The floating gate electrodes FG(6) are laid on the gate insulating films 5, respectively. Each film 5 and the electrode FG(6) provided on the film 5 constitute a two-layer member. Side surfaces of the two-layer member, which oppose the trenches, are thermally oxidized, thus forming oxide layers X on the side surfaces of the two-layer member. First buried insulators A are formed on the oxide layers X, thus covering the oxide layers X.

Figure 2:
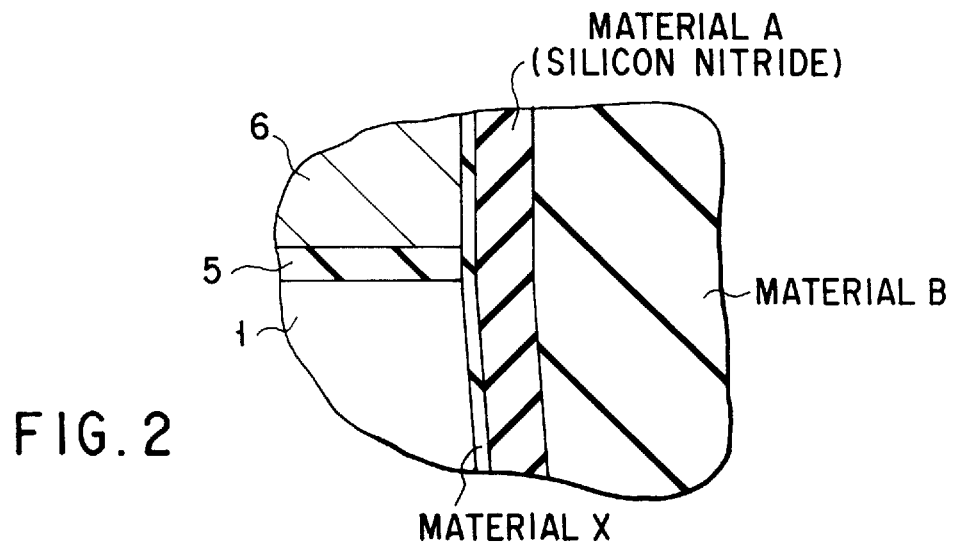
FIG. 2 is a magnified view of the part encircled by a broken line in FIG. 1B.

FIG. 2 is a magnified view of the part encircled by a broken line in FIG. 1B. As shown in FIG. 2, a second buried insulator B fills the gap between the two first buried insulators A provided on two opposing oxide layers X in each trench. That is, the second buried insulator B is formed on the first buried insulators A. Thus, each first buried insulator A is interposed between the second buried insulator B and the oxide layer X. In other words, each first buried insulator A is interposed between the second buried insulator B on the one hand and the gate insulating film 5 (tunnel oxide film) and floating gate electrode 6 on the other hand. Therefore, the impurities in the second buried insulator B cannot diffuse into the tunnel oxide film 5 unless they pass through the first buried insulator A.

In view of this, the first buried insulator A is made of material, such as silicon nitride, in which the impurities scarcely diffuse. Hence, the impurities hardly diffuses into the tunnel oxide film 5, and the memory cells are not deteriorated in terms of operating efficiency.

Figure 3:
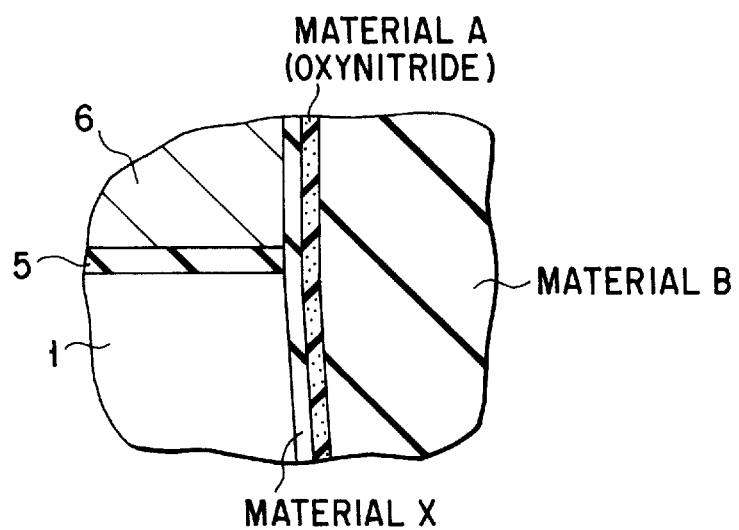
FIG. 3 is a magnified view of that part of the modification of the first embodiment, which corresponds to the part shown in FIG. 2.

The first buried insulator A need not be a deposited one. Instead, as shown in FIG. 3, it may be formed by processing the outer surface region of the oxide layer X into an oxynitride layer. The insulator A thus formed, i.e., the oxynitride layer, achieve the same advantage as described above.

In either case, the first buried insulator A greatly suppresses diffusion of impurities from the second buried insulator B into the tunnel oxide film 5, thereby preventing the memory cells from being deteriorated in operating efficiency. The first buried insulator A accomplishes this advantage even if the floating gate electrode FG(6) or the control gate electrodes CG(8) has a shape different from the one shown in FIGS. 1A to 1C.

NAND-type EEPROMs according to the present invention will be described, with reference to sectional views similar to FIG. 1B taken along line IB—IB shown in FIG. 1A.

Figure 4A:
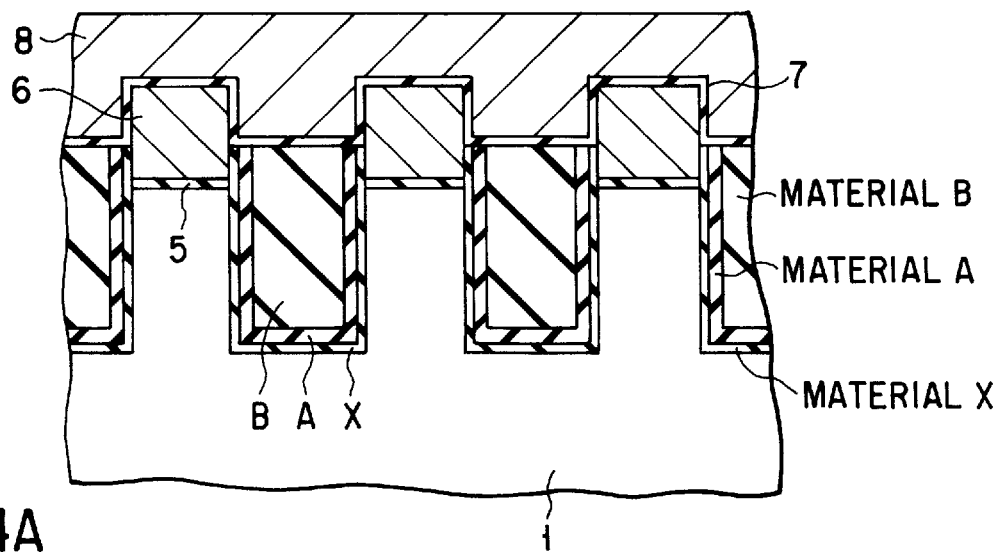
FIG. 4A is a sectional view of an NAND-type EPROM according to a second embodiment of this invention.

FIG. 4A is a sectional view of an NAND-type EEPROM according to the second embodiment of the invention. In the NAND-type EEPROM shown in FIG. 4A, the oxide layer X and the first buried insulator A are deposited on the side surfaces and bottom surface of the trench 3. Thus, the first buried insulator A is interposed between the second buried insulator B and the oxide layer X, which contacts the gate insulating film 5 (tunnel oxide film), floating gate electrode 6 and silicon substrate 1. The impurities in the second buried insulator B cannot, therefore, diffuse into the tunnel oxide film 5 unless they pass through the first buried insulator A.

In view of this, the first buried insulator A is made of material, such as silicon nitride or oxynitride, in which the impurities scarcely diffuse. Hence, the impurities contained in the second buried insulator B hardly diffuses into the tunnel oxide film 5, and the memory cells are not deteriorated in terms of operating efficiency. Furthermore, the first buried insulator A suppresses diffusion of impurities contained in the second buried insulator B into the silicon substrate 1 and ultimately reducing the leakage current at the junctions provided in the substrate 1.

FIG. 4B is a sectional view of a modification of the NAND-type EEPROM shown in FIG. 4A. In the NAND-type EEPROM shown in FIG. 4B, the oxide layer X is not provided. Rather, the first buried insulator A is deposited directly on the side surfaces and bottom surface of the trench 3. Thus, the first buried insulator A is interposed between the second buried insulator B on the one hand and the gate insulating film 5 (tunnel oxide film), floating gate electrode 6 and silicon substrate 1 on the other hand. The impurities in the second buried insulator B cannot, therefore, diffuse into the tunnel oxide film 5 unless they pass through the first buried insulator A.

In view of this, the first buried insulator A is made of material, such as silicon nitride or oxynitride, in which the impurities scarcely diffuse. Hence, the impurities contained in the second buried insulator B hardly diffuses into the tunnel oxide film 5, and the memory cells are not deteriorated in terms of operating efficiency. Furthermore, the first buried insulator A suppresses diffusion of impurities contained in the second buried insulator B into the silicon substrate 1 and ultimately reducing the leakage current at the junctions provided in the substrate 1.

FIG. 4C is a sectional view of another modification of the NAND-type EEPROM shown in FIG. 4A. In the NAND-type EEPROM shown in FIG. 4C, the oxide layer X is not deposited on the bottom surface of the trench 3. The first buried insulator A is not deposited on the bottom surface of the trench 3, either. Rather, the oxide layer X and the first buried insulator A are deposited only on the side surfaces of the trench 3. Since neither the oxide layer X nor the first buried insulator A is deposited on the bottom surface of the trench 3, the second buried insulator B directly contacts the substrate 1 at the bottom of the trench 3. Accordingly, the impurities in the second buried insulator B may diffuse into the substrate from the bottom of the trench 3. However, the impurities diffused into the substrate would not reach to the gate insulating film 5 (tunnel oxide film) and the floating gate electrode 6, since the distance between the bottom of the trench 3 on the one hand and the gate insulating film 5 (tunnel oxide film) and the floating gate electrode 6 on the other hand is large. In some cases, a small amount of the impurities diffused from the bottom of the trench may reach the gate insulating film 5 (tunnel oxide film) and the floating gate electrode 6. However, such a small amount of the impurities would not deteriorate the operating efficiency. The first buried insulator A is interposed between the second buried insulator B on the one hand and the gate insulating film 5 (tunnel oxide film), floating gate electrode 6 and silicon substrate 1 on the other hand The impurities in the second buried insulator B cannot, therefore, diffuse substantially into the tunnel oxide film 5 unless they pass through the first buried insulator A.

In view of this, the first buried insulator A is made of material, such as silicon nitride or oxynitride, in which the impurities scarcely diffuse. Hence, the impurities contained in the second buried insulator B hardly diffuses into the tunnel oxide film 5, and the memory cells are not deteriorated in terms of operating efficiency. Furthermore, the first buried insulator A suppresses diffusion of impurities contained in the second buried insulator B into the silicon substrate 1 and ultimately reducing the leakage current at the junctions provided in the substrate 1.

FIG. 4D is a sectional view of a further modification of the NAND-type EEPROM shown in FIG. 4A. In the NAND-type EEPROM shown in FIG. 4D, the oxide layer X is not provided neither on deposited. The first buried insulator A is not deposited on the bottom surface of the trench 3, either. Rather, the first buried insulator A is deposited directly only on the side surfaces of the trench 3. Since neither the oxide layer X nor the first buried insulator A is deposited on the bottom surface of the trench 3, the second buried insulator B directly contacts the substrate 1 at the bottom of the trench 3. Accordingly, the impurities in the second buried insulator B may diffuse into the substrate from the bottom of the trench 3. However, the impurities diffused into the substrate would not reach to the gate insulating film 5 (tunnel oxide film) and the floating gate electrode 6, since the distance between the bottom of the trench 3 on the one hand and the gate insulating film 5 (tunnel oxide film) and the floating gate electrode 6 on the other hand is large. In some cases, a small amount of the impurities diffused from the bottom of the trench may reach the gate insulating film 5 (tunnel oxide film) and the floating gate electrode 6. However, such a small amount of the impurities would not deteriorate the operating efficiency. The first buried insulator A is interposed between the second buried insulator B and the oxide layer X, which contacts the gate insulating film 5 (tunnel oxide film), floating gate electrode 6 and silicon substrate 1. The impurities in the second buried insulator B cannot, therefore, diffuse substantially into the tunnel oxide film 5 unless they pass through the first buried insulator A.

In view of this, the first buried insulator A is made of material, such as silicon nitride or oxynitride, in which the impurities scarcely diffuse. Hence, the impurities contained in the second buried insulator B hardly diffuses into the tunnel oxide film 5, and the memory cells are not deteriorated in terms of operating efficiency. Furthermore, the first buried insulator A suppresses diffusion of impurities contained in the second buried insulator B into the silicon substrate 1 and ultimately reducing the leakage current at the junctions provided in the substrate 1.

A method of manufacturing the memory cells of the NAND-type EEPROM according to the second embodiment will be described, with reference to FIGS. 5 to 9.

Figure 5:
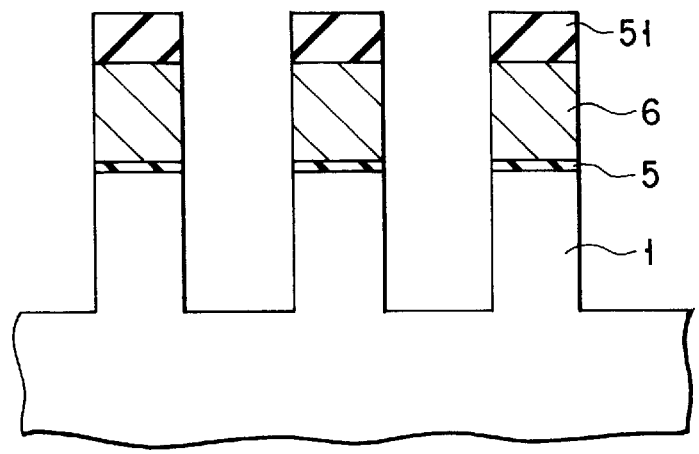
FIG. 5 is a sectional view explaining a first step of manufacturing the NAND-type EEPROM shown in FIG. 4A.

First, as shown in FIG. 5, the surface of a p-type silicon substrate 1 is oxidized, forming an oxide film. Ion implantation is effected, thereby forming well regions and various channel regions in the substrate 1. Then, the oxide film is removed from the silicon substrate 1, and a gate oxide film (not shown) of peripheral circuits and an oxide film 5 are formed. A conductor layer 6 made of, for example, polysilicon, is formed on the oxide film 5. A silicon nitride film 51 is deposited on the conductor layer 6. A resist is coated on the silicon nitride film 51 and subsequently patterned, forming a resist pattern. Using the resist pattern as a mask, the silicon nitride film 51, conductor layer 6 and oxide film 5 are subjected to selective etching, exposing some parts of the silicon substrate 1, thereby forming floating gates 6 and gate insulating films 5. The exposed parts of the substrate 1 are etched, making trenches in the silicon substrate 1. Then, the resist pattern is removed.

Figure 6:
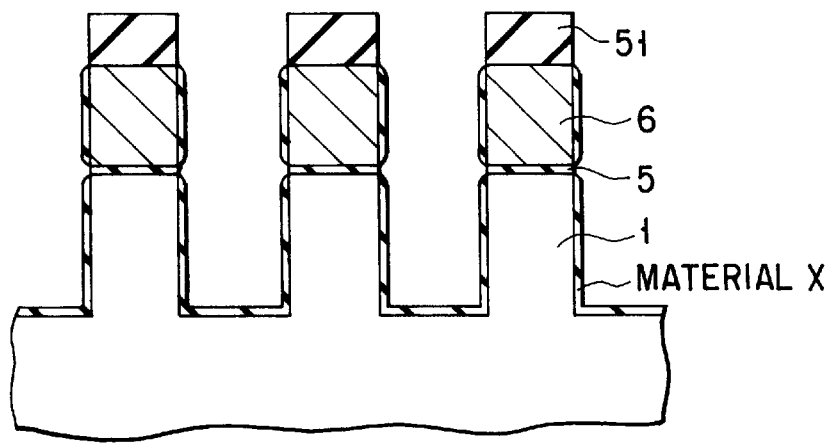
FIG. 6 is a sectional view explaining a second step of manufacturing the NAND-type EEPROM shown in FIG. 4A.
Figure 7:
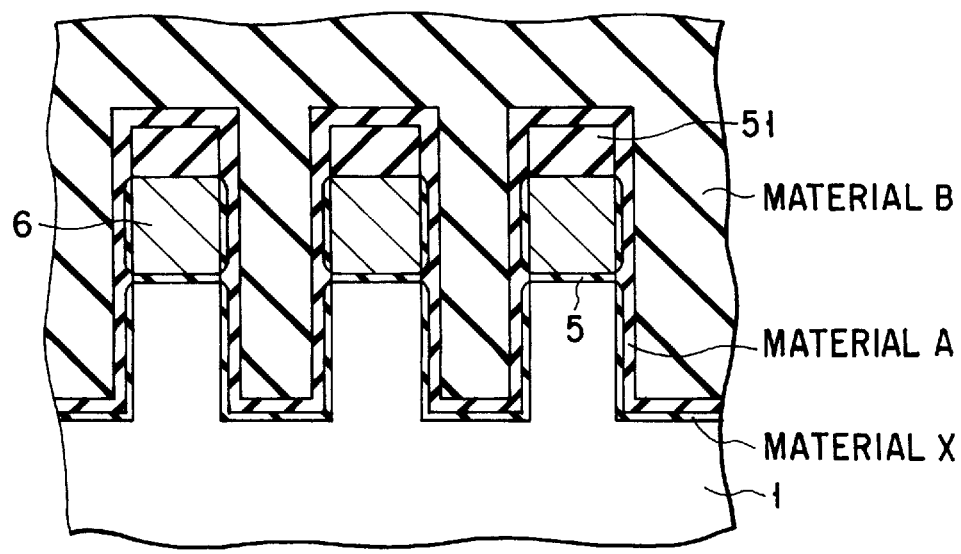
FIG. 7 is a sectional view explaining a third step of manufacturing the NAND-type EEPROM shown in FIG. 4A.

Next, as shown in FIG. 6, the entire surface of each trench 3 is oxidized, thereby forming oxide layers X. Further, a layer A made of, for example, silicon nitride is deposited on the oxide layers X and on the top and sides of each silicon nitride film 51. Still further, as shown in FIG. 7, a layer B made of, for example, TEOS is deposited, covering the layer A and filling all trenches 3 and the gaps between the floating gates 6. As a result, each trench 3 is filled with two different materials A and B. The layer B does not contact the gate insulating films 5.

The resultant structure is subjected to heat treatment at about 800° C. to 1000° C., thereby annealing the layer B and, thus, densifying the same. The layer A is made of material resistant to oxidation, such as silicon nitride, and thus, the oxidizing atmosphere which cannot be applied to the conventional structures can be applied to in the heat-treating step, without oxidizing the silicon substrate 1 or forming crystal defects therein in the oxidizing atmosphere.

Since the layer B is densified in the oxidizing atmosphere, the wet-etching rate of the layer B decreases. Furthermore, no boundary is formed in the layer B and thus the buried structure has a preferable configuration.

Figure 8:
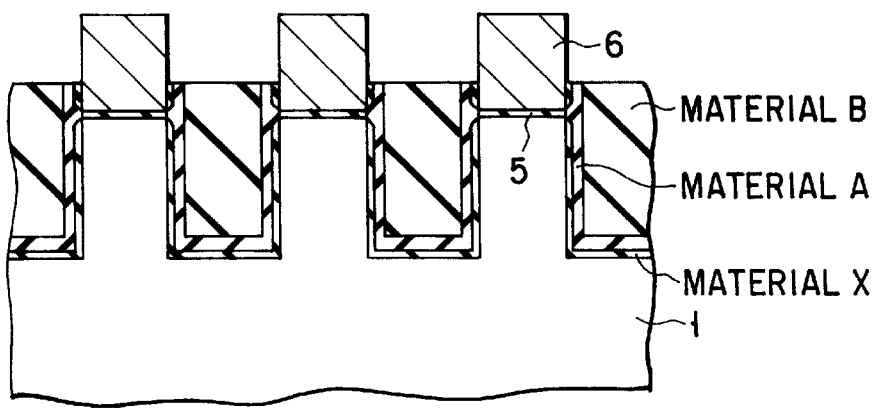
FIG. 8 is a sectional view explaining a fourth step of manufacturing the NAND-type EEPROM shown in FIG. 4A.
Figure 9:
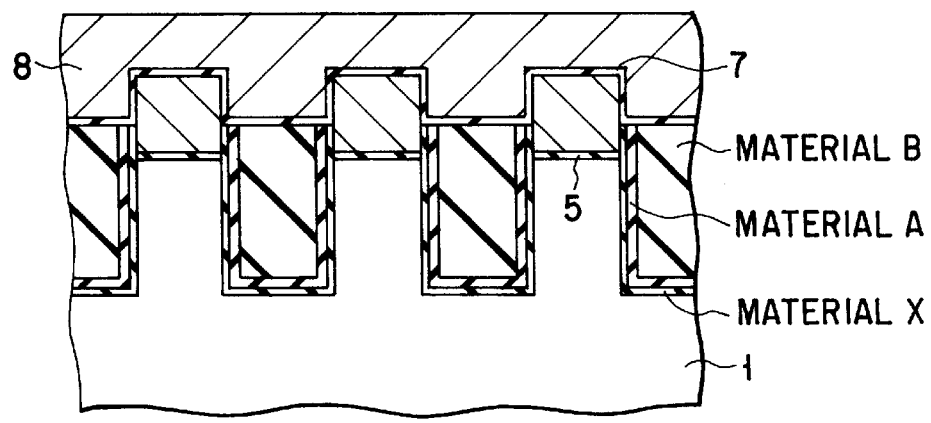
FIG. 9 is a sectional view explaining a fifth step of manufacturing the NAND-type EEPROM shown in FIG. 4A.

Thereafter, as shown in FIG. 8, the layer B and the layer A are polished by means of CMP (Chemical Mechanical Polishing), until the tops of the silicon nitride films 51 are exposed. The films 51, which have been used as a mask, are removed, exposing the floating gates 6. Then, the layers B and A are etched back to the level shown in FIG. 8. An inter-layer insulating film (ONO film) 7 is formed on the floating gates 6 and the tops of the layers B and A, as shown in FIG. 9. Conductor layers 8, or control gates, are then formed on the inter-layer insulating film 7. Thus, the memory cell of the NAND-type EEPROM are manufactured as illustrated in FIG. 9.

The method described with reference to FIGS. 5 to 8 can be used to manufacture not only the memory cells of an NAND-type EEPROM, but also those of a NOR-type EEPROM, a DINOR-type EEPROM, an AND-type EPROM, and transistors of MOS (MIS) structure. Hence, in the semiconductor device of the invention, which has MOS (MIS) structure, the diffusion of impurities from the layer B into the gate insulating films 5 is suppressed, thereby preventing the memory cells from being deteriorated in terms of operating efficiency. Moreover, since the diffusion of impurities from the layer B into the silicon substrate 1 is suppressed, the leakage current can be reduced at the junctions provided in the substrate 1.

Figure 10:
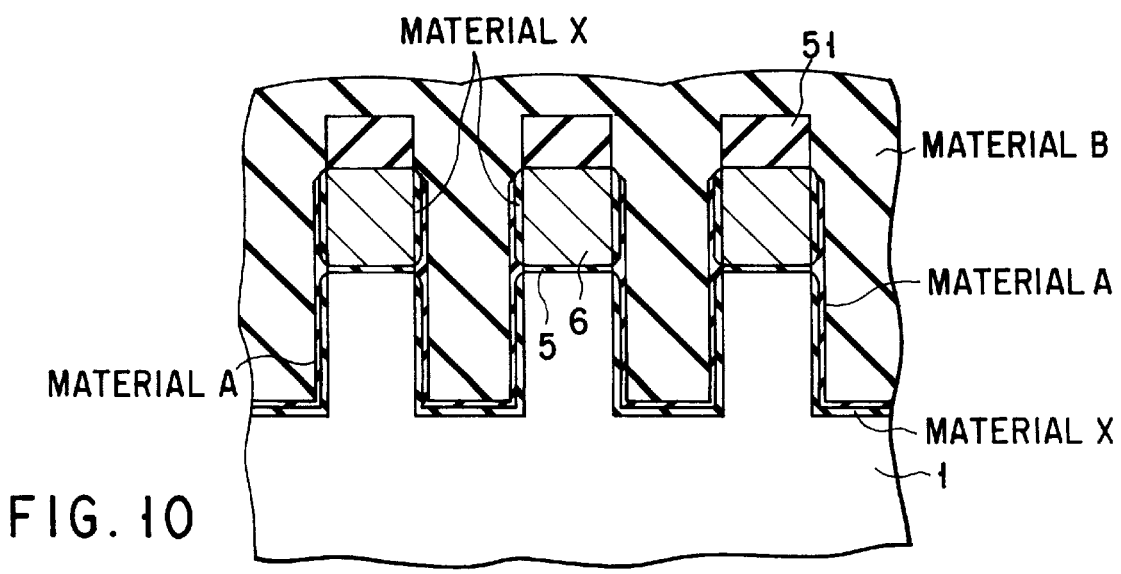
FIG. 10 is a sectional view explaining a step of manufacturing a further modification of the NAND-type EEPROM shown in FIG. 4A.

A modification of the method explained above with reference to FIGS. 5 to 8 will be described. Steps identical to those explained with reference to FIGS. 5 and 6 are performed. Then, the oxide layers X on the inner surfaces of each trench 3 are changed to oxynitride layers. Further, a layer B is deposited, covering the layer A and filling all trenches 3 and the gaps between the floating gates 6, as is illustrated in FIG. 10. Thereafter, the same steps as those described with reference to FIGS. 8 and 9 are carried out.

Figure 11:
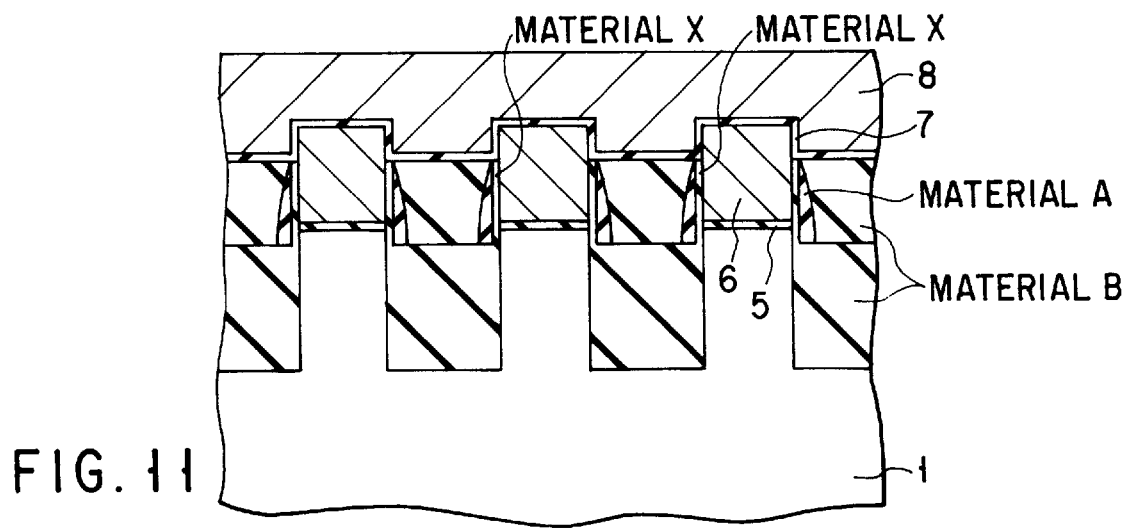
FIG. 11 is a sectional view of an NAND-type EEPROM according to a third embodiment of the invention.

FIG. 11 is a sectional view of an NAND-type EEPROM according to a third embodiment of the invention. The layers A are deposited on the thermal oxide films X. The layers A are provided corresponding to the sides of each floating gate 6, the sides of each gate insulating film 5 and the sides of the upper portions of the substrate 1 defining each trench 3. Alternatively, the layers A may be deposited directly on the sides of each floating gate 6, the sides of each gate insulating film 5 and the sides of the upper portions of the substrate 1 defining each trench 3. The layers A are not provided on the other portions of the sides of the substrate 1 defining each trench 3. The layer B is deposited on the layers A and, therefore, opposes the floating gate 6 and the gate insulating films 5 via the layer A. The impurities in the layer B cannot diffuse into the gate insulating films 5 or the floating gates 6 unless they pass through the layers A. The layers A are made of material, such as silicon nitride, in which the impurities in the layer B diffuse only in a small amount. Hence, the impurities hardly diffuse into the gate insulating films 5. This prevents the memory cells from being deteriorated in their operating efficiency.

A method of manufacturing the memory cells of the NAND-type EEPROM according to the third embodiment will be described, with reference to FIGS. 12 to 15.

Figure 12:
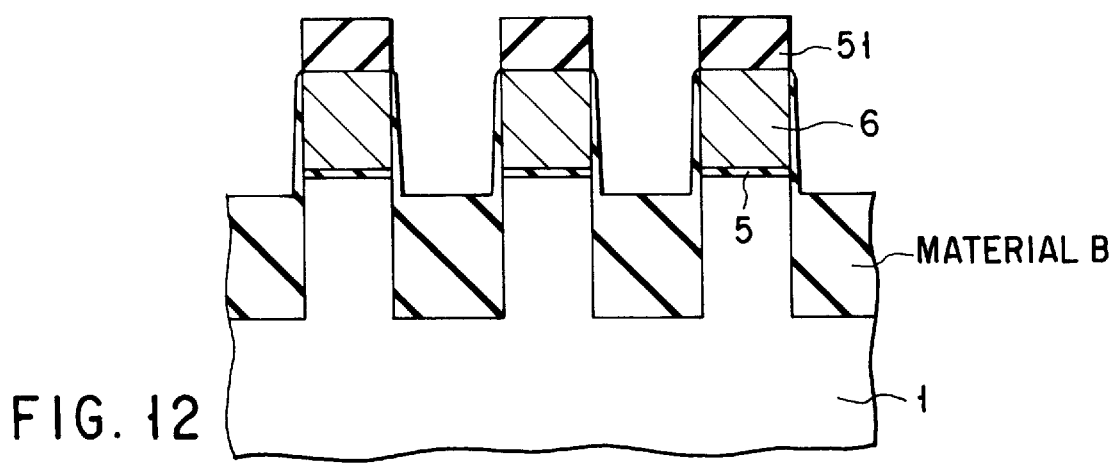
FIG. 12 is a sectional view explaining a first step of manufacturing the NAND-type EEPROM shown in FIG. 11.

The steps explained with reference to FIGS. 5 and 6 are performed. Then, layers B of, for example, TEOS, are deposited in trenches, each having its surfaces oxidized. Thereafter, as shown in FIG. 12, the layers B are etched until their upper surfaces lower to a level a little below gate insulating films 5 and the upper surface of the silicon substrate 1.

Figure 13:
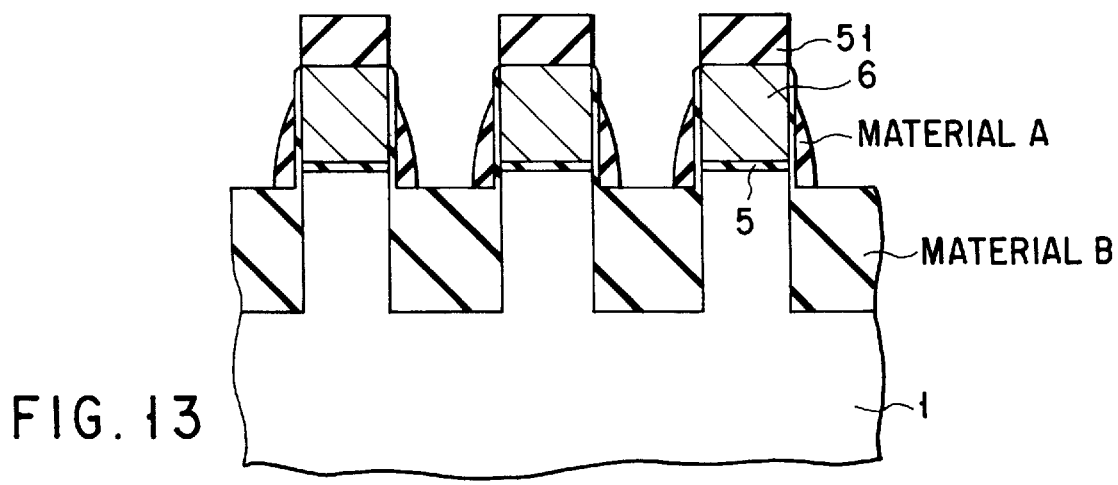
FIG. 13 is a sectional view explaining a second step of manufacturing the NAND-type EEPROM shown in FIG. 11.

Next, layers A of, for example, silicon nitride is deposited in the trenches. The layers A are etched back so that parts of them remain on the sides of the gate insulating films 5 and the floating gates 6 as is shown in FIG. 13. A layer B is deposited on the entire surface of the resultant structure.

Figure 14:
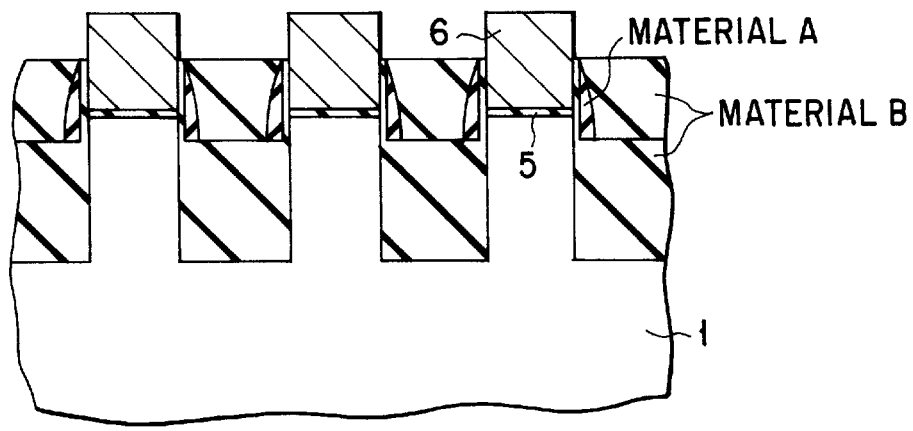
FIG. 14 is a sectional view explaining a third step of manufacturing the NAND-type EEPROM shown in FIG. 11.
Figure 15:
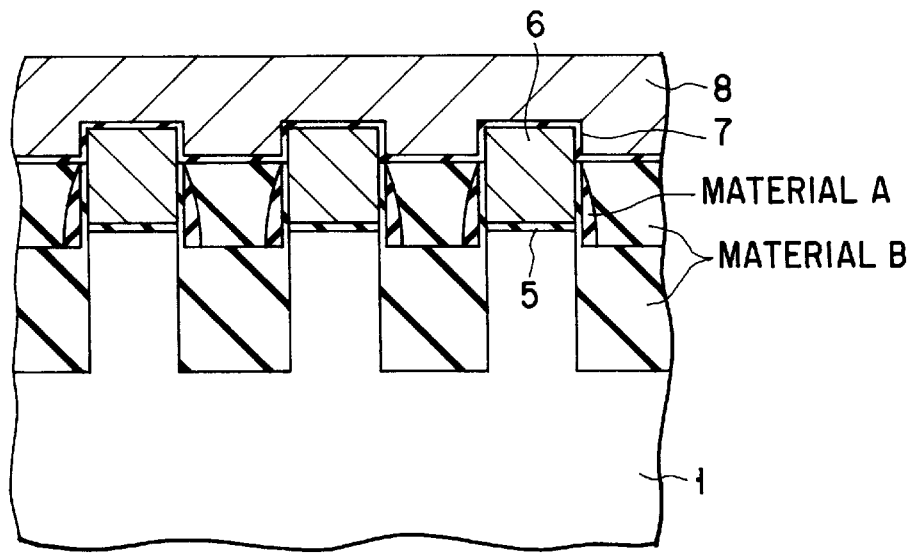
FIG. 15 is a sectional view explaining a fourth step of manufacturing the NAND-type EEPROM shown in FIG. 11.

Thereafter, the buried insulating film is polished and made flat at the top surface, and then the mask is removed, exposing the floating gates 6 as is illustrated in FIG. 14. The buried insulating film is etched back, an ONO film is formed, and control gates are deposited. The memory cells of the NAND-type EEPROM are thereby manufactured as shown in FIG. 15.

The steps performed to provide the structure shown in FIG. 14 may be performed to manufacture transistors, as well as the memory cells of a NAND-type EEPROM. In the structure according to the invention, the impurities in the layer B hardly diffuse into the gate insulating films 5. This prevents the memory cells from being deteriorated in their operating efficiency. In addition, the impurities in the layer B diffuse into those parts of the silicon substrate 1 which are near the channels, but at a lower rate than in the conventional device being manufactured. Therefore, the leakage current can be reduced at the junctions provided in the silicon substrate 1.

Figure 16:
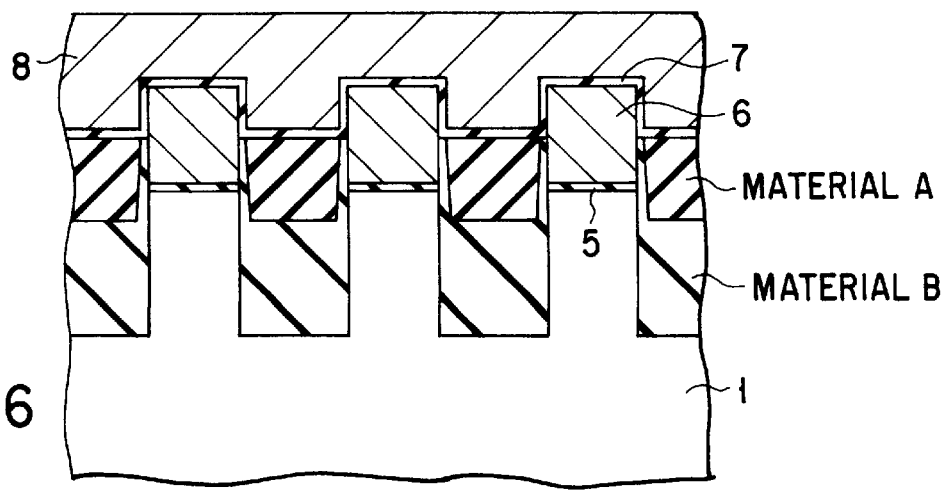
FIG. 16 is a sectional view of an NAND-type EEPROM according to a fourth embodiment of the present invention.

FIG. 16 is a sectional view of an NAND-type EEPROM according to the fourth embodiment of the present invention. In the fourth embodiment, an insulating film buried in each trench is composed of two parts made of different materials. More specifically, the lower part located below gate insulating films 5 and the floating gates 6 is made of material B, and the upper part located corresponding to the gate insulating films 5 and the floating gates 6 is made of material A. In the structure of FIG. 16, the impurities in the material B cannot diffuse into the gate insulating films 5 or the floating gates 6 unless they pass through the material A. The material A is, for example, silicon nitride in which the impurities in the material B diffuse only in a small amount. Hence, the impurities hardly diffuse into the gate insulating films 5. This prevents the memory cells from being deteriorated in their operating efficiency. Furthermore, the impurities in the material B diffuse into those parts of the silicon substrate 1 which are near the channels, but at a lower rate than in the conventional device being manufactured. Therefore, the leakage current can be reduced at the junctions provided in the silicon substrate 1.

Figure 17:
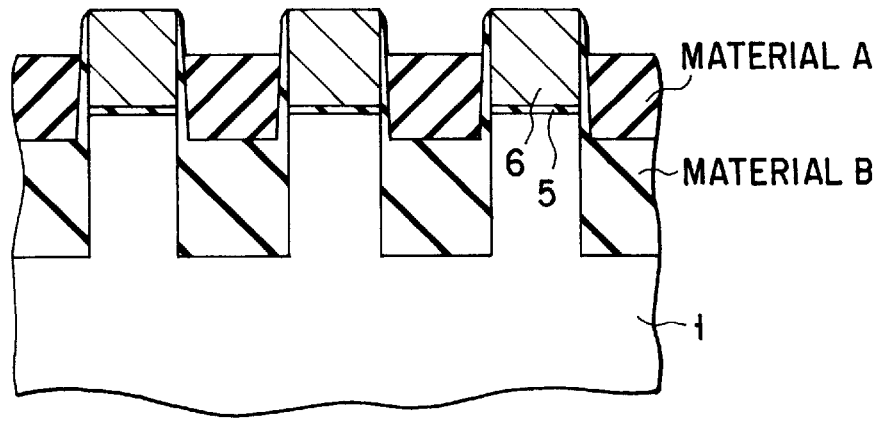
FIG. 17 is a sectional view explaining a step of manufacturing the NAND-type EEPROM shown in FIG. 16.

A method of manufacturing the memory cells of the NAND-type EEPROM according to the fourth embodiment will be described, with reference to FIG. 17.

The steps explained with reference to FIGS. 5 and 6 are performed. Then, layers B of, for example, TEOS, are deposited in trenches, each having its inner surfaces oxidized. Thereafter, as shown in FIG. 12, the layers B are etched until their upper surfaces lower to a level a little below gate insulating films 5 and the upper surface of the silicon substrate 1.

Thereafter, layers A of, for example, silicon nitride is deposited in the trenches. The layers A are polished and made flat at the top, thereby exposing the floating gates 6 as is depicted in FIG. 17. The steps performed thus far may be performed to manufacture transistors, as well as the memory cells of a NAND-type EEPROM. In the structure according to the invention, the impurities in the material B hardly diffuse into the gate insulating films 5. This prevents the memory cells from being deteriorated in their operating efficiency and reduces the leakage current at the junctions provided in the silicon substrate 1.

Figure 18:
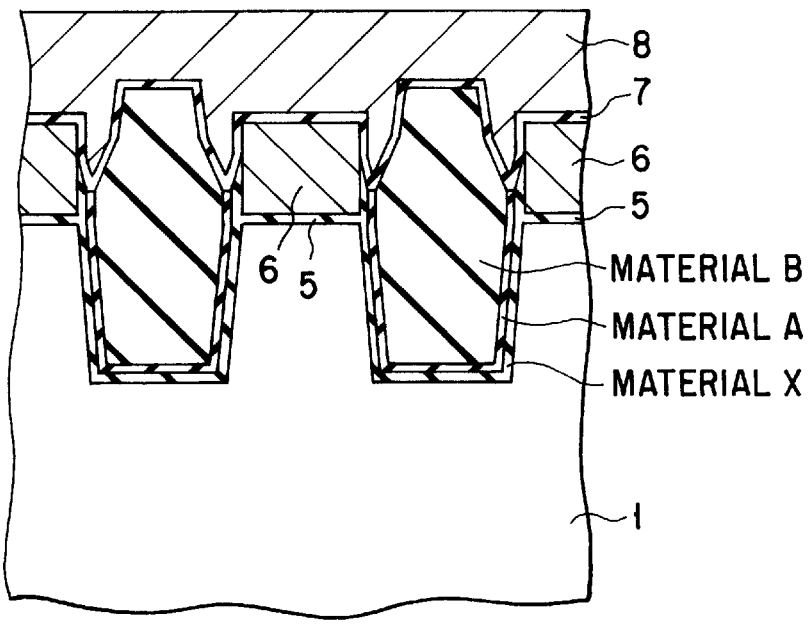
FIG. 18 is a sectional view of a NAND-type EEPROM according to a fifth embodiment of this invention.

FIG. 18 is a sectional view of a NAND-type EEPROM according to the fifth embodiment of this invention. That part of the fifth embodiment near the gate insulting films 5 is identical to the corresponding part of the first embodiment shown in FIG. 2. The fifth embodiment differs in that portions of the silicon nitride films and the silicon oxide films which cover portions of the sides of each floating gate 6 are removed. Each of the portions is used as capacitance between the floating gate 6 and a control gate 8. The coupling ratio is thereby increased, improving the electric characteristic of the memory cells.

A method of manufacturing the memory cells of the NAND-type EEPROM according to the fifth embodiment will be described, with reference to FIGS. 19 to 24.

Figure 19:
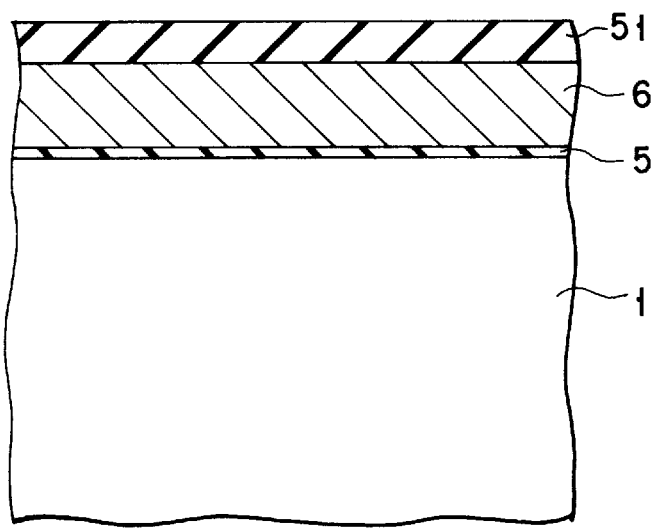
FIG. 19 is a sectional view explaining a first step of manufacturing the NAND-type EEPROM shown in FIG. 18.

First, as shown in FIG. 19, an oxide film 5 is formed on a silicon substrate 1. A conductor layer 6, for example a polysilicon film, is formed on the oxide film 5. The conductor layer 6 will be processed to form floating gates. Further, a silicon nitride film 51, which will be processed to form a mask, is formed on the conductor layer 6.

Figure 20:
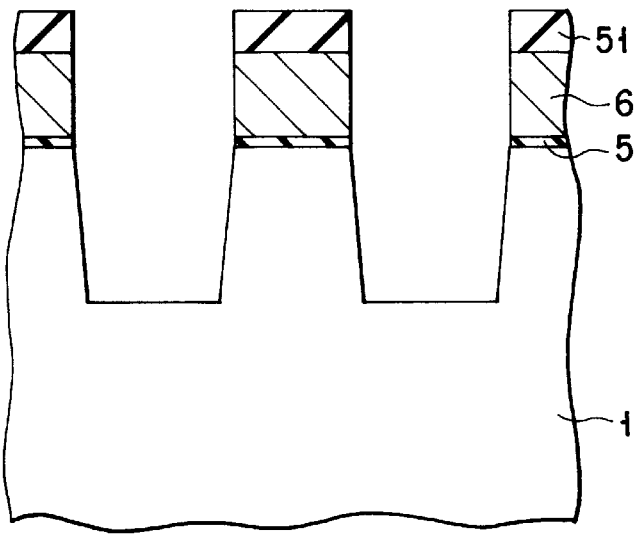
FIG. 20 is a sectional view explaining a second step of manufacturing the NAND-type EEPROM shown in FIG. 18.

Next, as shown in FIG. 20, a resist is coated on the silicon nitride film 51 and subjected to patterning, forming a resist pattern. Using the resist pattern as a mask, the silicon nitride film 51, polysilicon film 6 and oxide film 5 are sequentially etched, exposing parts of the silicon substrate 1. The parts of the substrate 1, thus exposed, are etched, whereby trenches are made in the surface of the silicon substrate 1. The resist pattern is removed.

Figure 21:
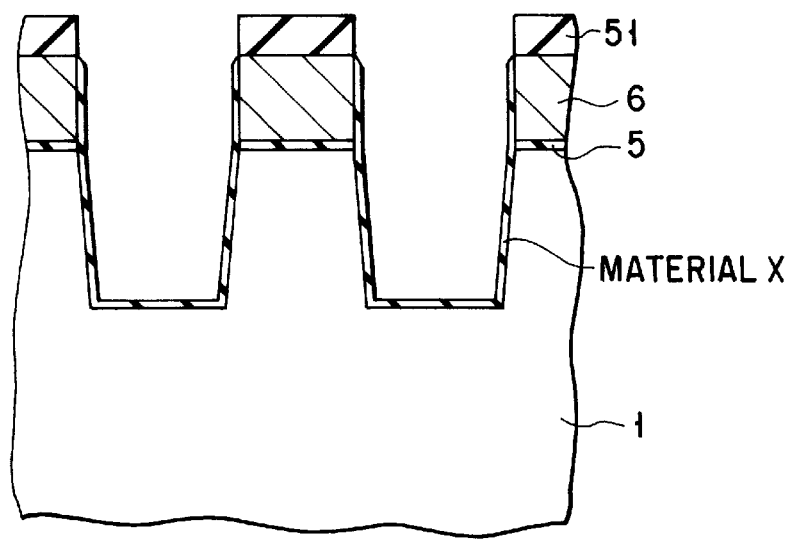
FIG. 21 is a sectional view explaining a third step of manufacturing the NAND-type EEPROM shown in FIG. 18.
Figure 22:
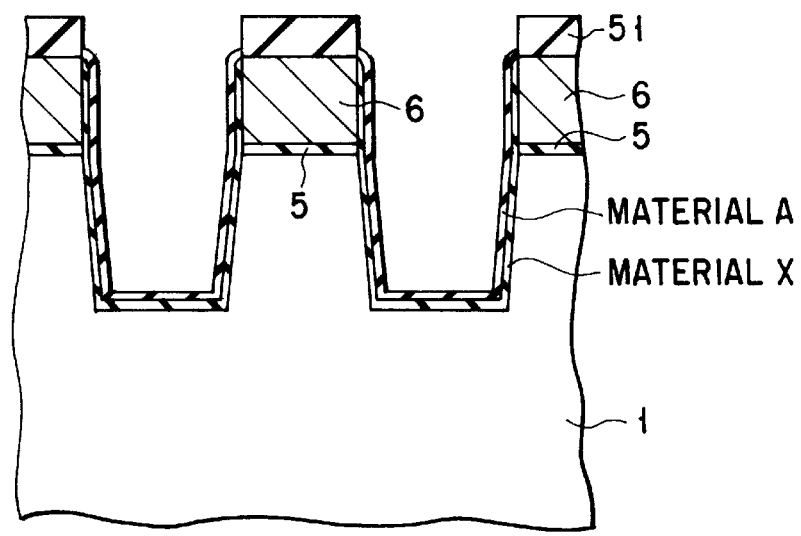
FIG. 22 is a sectional view explaining a fourth step of manufacturing the NAND-type EEPROM shown in FIG. 18.

Thermal oxidation is performed, oxidizing the inner surfaces of each trench and forming a silicon oxide film X as shown in FIG. 21. As shown in FIG. 22, silicon nitride films A are formed, each in one trench and on the silicon oxide film X. Thereafter, a layer B of, for example, TEOS is deposited, filling the trenches. The layer B is polished, providing a structure shown in FIG. 23, which has a flat upper surface.

Figure 24:
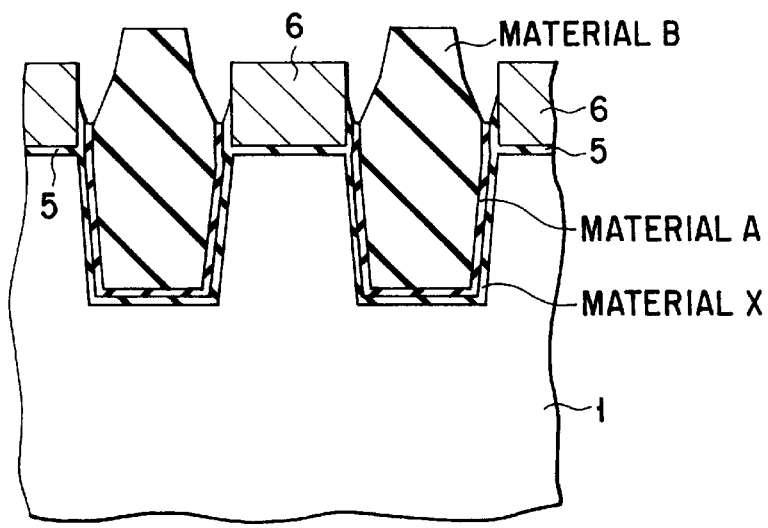
FIG. 24 is a sectional view explaining a sixth step of manufacturing the NAND-type EEPROM shown in FIG. 18.

As shown in FIG. 24, the silicon nitride film 51 is removed. More specifically, the film 51, which has been used as a mask, is over-etched and, thus, completely removed. As the film 51 is removed, the silicon nitride films A covering the inner surfaces of the trenches and the sides of the floating gates 6 recede downwards. Then, diluted hydrofluoric acid is applied, thereby removing the silicon oxide film X and layer B from the upper parts of the sides of each floating gate 6 made of polysilicon.

Thereafter, an inter-layer insulating film (ONO film) 7 and a second conductor layer 8 are formed. The second conductor layer 8 is, for example, a polysilicon layer, and will be processed to form control gates. The memory cells of the NAND-type EEPROM, shown in FIG. 18, are thus manufactured. In the present embodiment, the silicon nitride film 51 is removed from the structure illustrated in FIG. 23. Before removing the film 51, the layer filling the trenches may be etched back.

Figure 23:
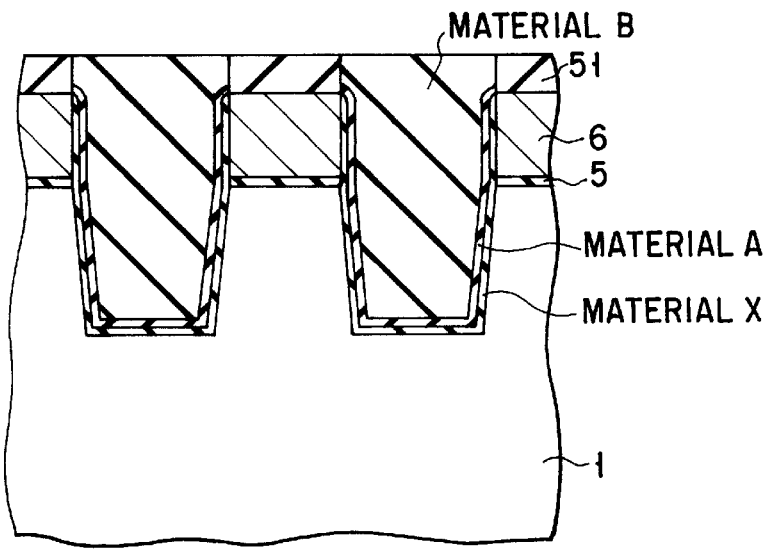
FIG. 23 is a sectional view explaining a fifth step of manufacturing the NAND-type EEPROM shown in FIG. 18.
Figure 25:
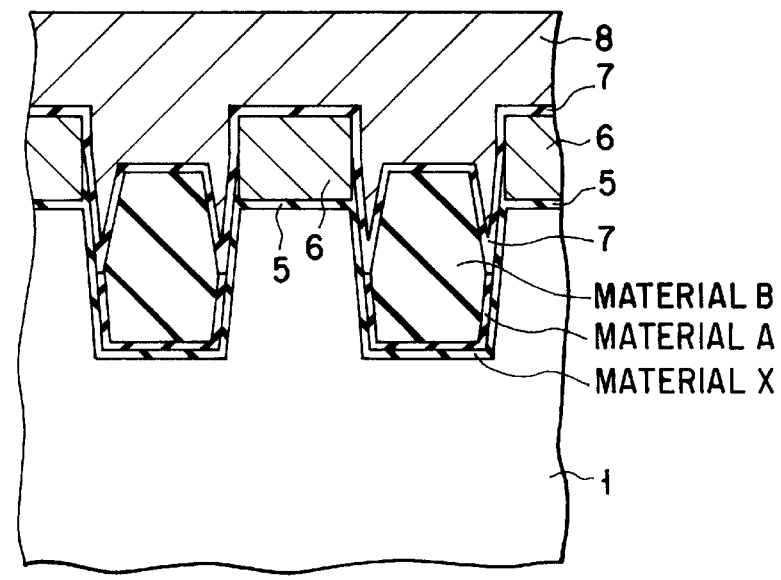
FIG. 25 is a sectional view of a NAND-type EEPROM according to a sixth embodiment of the invention.
Figure 26:
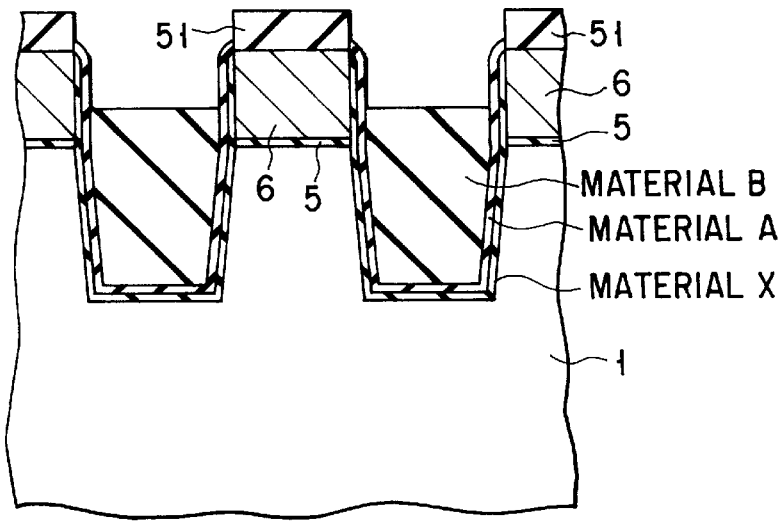
FIG. 26 is a sectional view explaining a step of manufacturing the NAND-type EEPROM shown in FIG. 25.

FIG. 25 is a sectional view of a NAND-type EEPROM according to the sixth embodiment of the invention. The sixth embodiment is manufactured in the same way as the fifth embodiment shown in FIG. 18, except for two respects. First, the layer filling the trenches is etched back as shown in FIG. 26 after this layer has been made flat at the top as shown in FIG. 23. Second, the silicon nitride films A are etched more than in the fifth embodiment, whereby those parts of each film A which cover the inner surfaces of the trench more recede than those parts contacting the gate insulating films 5 and the floating gates 6.

Then, as shown in FIG. 25, those parts of the silicon oxide films X and B which contact the sides of each floating gate 6 are removed, and an inter-layer insulating film (ONO film) 7 and a second conductor layer 8 are formed. The second conductor layer 8 is, for example, a polysilicon layer, and will be processed to form control gates. The memory cells of the NAND-type EEPROM, shown in FIG. 25, are thus manufactured.

In the structure of FIG. 18, the silicon nitride layer A and the inter-layer insulating film (ONO film) 7 connected to the layer A are provided between the the layer B (e.g., TEOS layer) on the one hand and the gate insulating films 5 and floating gates 6 on the other hand. Thus, the layer A and the film 7 serve to suppress diffusion of impurities from the layer B into the gate insulating films 5. This prevents the memory cells from being deteriorated in their operating efficiency.

In the structure of FIG. 25, the inter-layer insulating film (ONO film) 7 is provided between the the layer B (e.g., TEOS layer) on the one hand and the gate insulating films 5 and floating gates 6 on the other hand. Thus, the film 7 serves to suppress diffusion of impurities from the layer B into the gate insulating films 5. This prevents the memory cells from being deteriorated in their operating efficiency.

In both structures of FIGS. 18 and 25, the layer A is provided between the silicon substrate 1 and the the layer B (e.g., TEOS layer). The layer A suppresses diffusion of impurities from the layer B into the silicon substrate 1, making it possible to reduce the leakage current at the junctions provided in the silicon substrate 1.

Moreover, the layer B can be heated and densified in an oxidizing atmosphere before it is polished to have a flat upper surface. The layer A is made of material, such as silicon nitride, which hardly allows passage of oxidizing material, and thus the oxidizing atmosphere which cannot be applied to the conventional structures can be applied to in the heat-treating step. Since the layer B is densified by heat treatment in the oxidizing atmosphere as in the second embodiment, its wet-etching rate decreases. Once the layer B has been densified, no boundary is formed in the layer B, and thus the buried structure has a preferable configuration in each trench 3.

Figure 27:
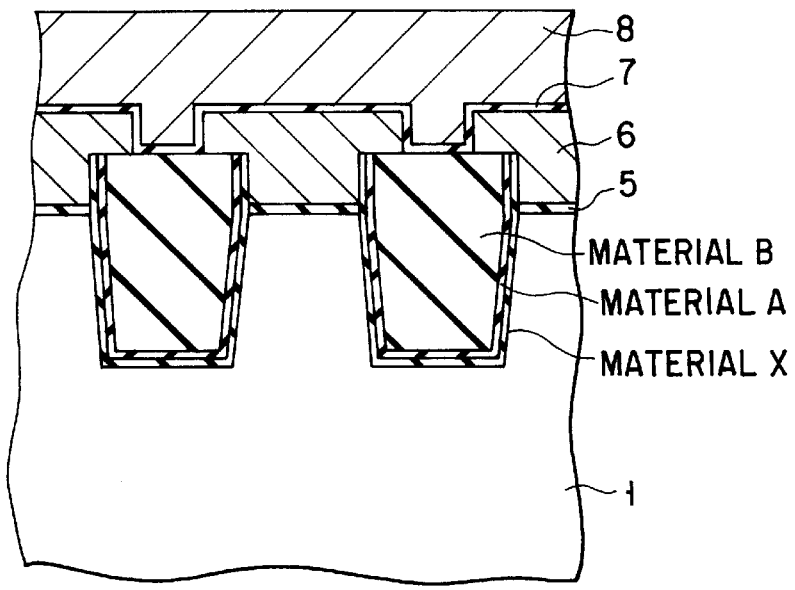
FIG. 27 is a sectional view of a NAND-type EEPROM according to a seventh embodiment of the invention.

FIG. 27 is a sectional view of a NAND-type EEPROM according to the seventh embodiment of this invention. That part of the seventh embodiment near the gate insulting films 5 is identical to the corresponding part of the first embodiment shown in FIG. 2. The seventh embodiment differs from the structure of FIG. 4 in the shape of each floating gate 6. Having this specific shape, the floating gate 6 increases the capacitance between it and the control gate 8. The coupling ratio is thereby increased, improving the electric characteristic of the memory cells.

A method of manufacturing the memory cells of the NAND-type EEPROM according to the fifth embodiment will be described, with reference to FIGS. 28 to 32.

Figure 28:
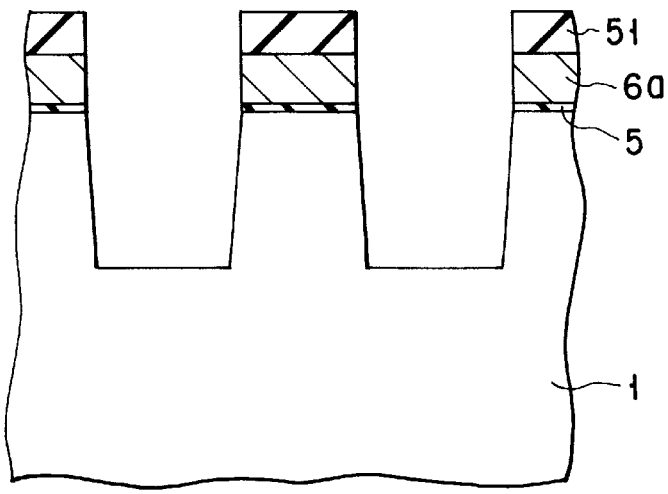
FIG. 28 is a sectional view explaining a first step of manufacturing the NAND-type EEPROM shown in FIG. 27.

First, as shown in FIG. 28, an oxide film 5 is formed on a silicon substrate 1. A conductor layer 6a, for example a polysilicon film, is formed on the oxide film 5. The conductor layer 6 will be processed to form floating gates. Further, a silicon nitride film 51, which will be processed to form a mask, is formed on the conductor layer 6. A resist is coated on the silicon nitride film 51 and subjected to patterning, forming a resist pattern (not shown). Using the resist pattern as a mask, the silicon nitride film 51, polysilicon film 6a and oxide film 5 are sequentially etched, exposing parts of the silicon substrate 1. The parts of the substrate 1, thus exposed, are etched, whereby trenches are made in the surface of the silicon substrate 1. The resist pattern is removed.

Figure 29:
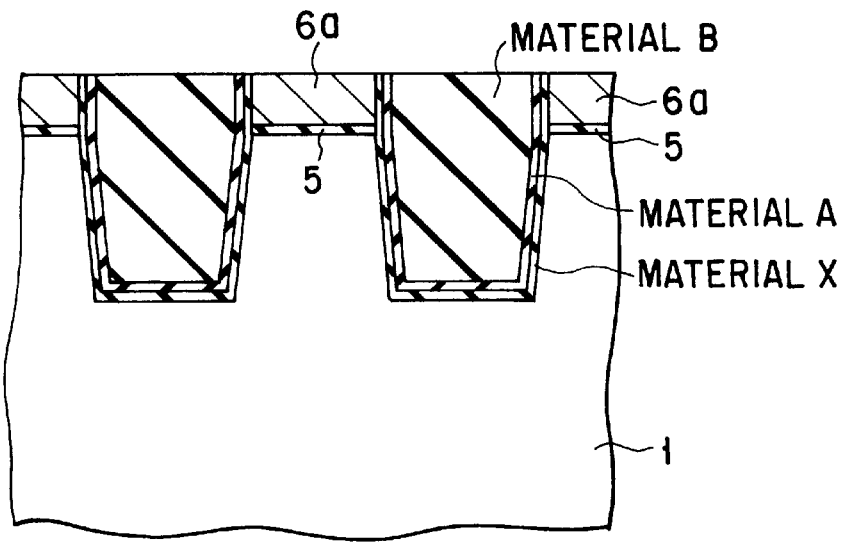
FIG. 29 is a sectional view explaining a second step of manufacturing the NAND-type EEPROM shown in FIG. 27.

Thermal oxidation is performed, oxidizing the inner surfaces of each trench and forming a silicon oxide film X as shown in FIG. 29. Further, silicon nitride films A are formed, each in one trench and on the silicon oxide film X. Thereafter, a layer B of, for example, TEOS is deposited, filling the trenches. The layer B is polished, forming a structure having a flat upper surface as is illustrated in FIG. 29.

Figure 30:
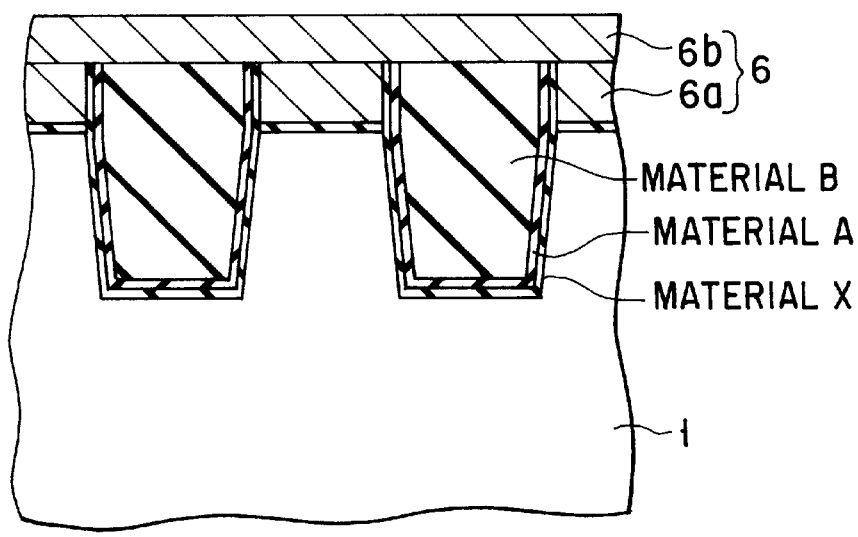
FIG. 30 is a sectional view explaining a third step of manufacturing the NAND-type EEPROM shown in FIG. 27.

As shown in FIG. 30, a conductor layer 6b, for example, a polysilicon layer, is formed on the flat upper surface of the structure. (The conductor layer 6b will be processed to form parts of floating gates.) The layer 6b covers the polysilicon films 6a already formed.

Figure 31:
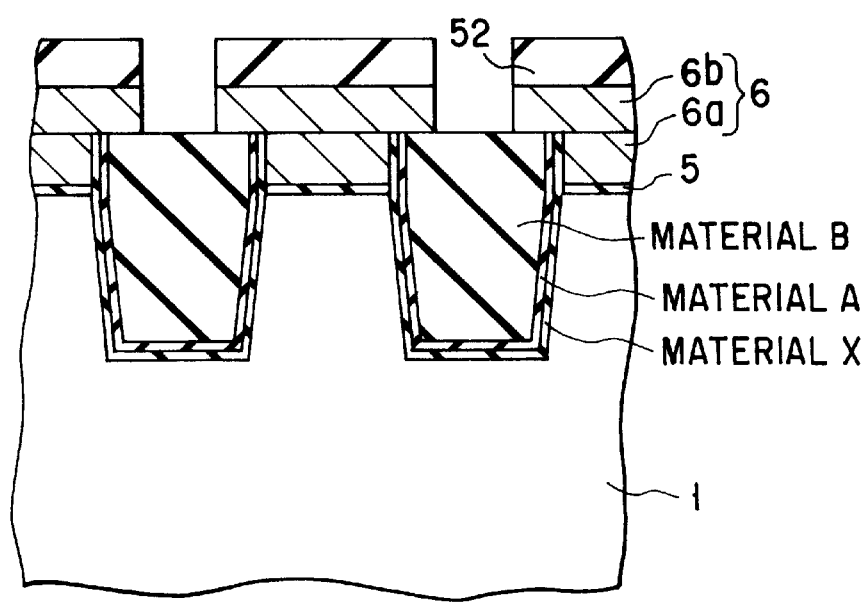
FIG. 31 is a sectional view explaining a fourth step of manufacturing the NAND-type EEPROM shown in FIG. 27.

Next, a silicon nitride film is formed on the upper surface of the resultant structure, and then the silicon nitride film is patterned, forming silicon nitride patterns 52 having slits, as illustrated in FIG. 31. Using the silicon nitride patterns 52 as masks, the conductive layer 6b is patterned, as shown in FIG. 31.

Figure 32:
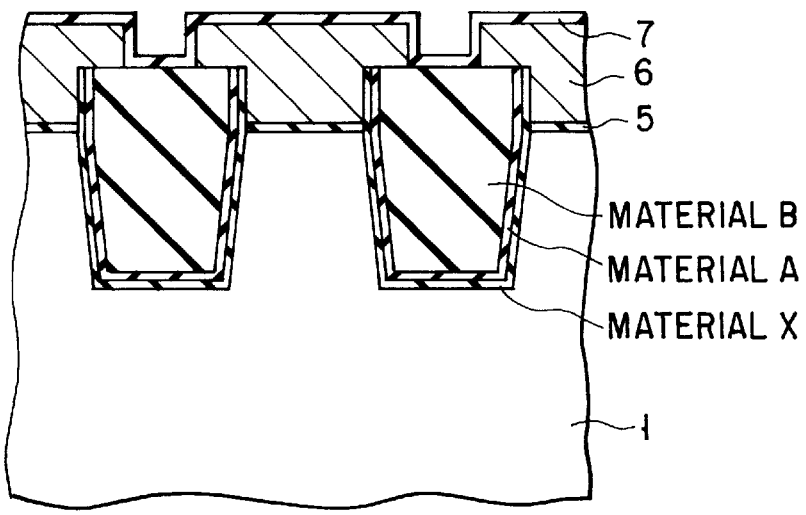
FIG. 32 is a sectional view explaining a fifth step of manufacturing the NAND-type EEPROM shown in FIG. 27.

As shown in FIG. 32, the silicon nitride mask film 52 is removed. Further, an inter-layer insulating (ONO) film 7 is formed. Thereafter, as shown in FIG. 27, a second conductor layer 8 is formed on the insulating film 7. The second conductor layer 8 is, for example, a polysilicon layer, which will be processed to provide control gates. As a result, the memory cells of the NAND-type EEPROM, shown in FIG. 27, are manufactured.

The seventh embodiment shown in FIG. 27 has the same advantages as the second embodiment. That is, diffusion of impurities from the layer B into the gate insulating films 5 is suppressed, preventing the memory cells from being deteriorated in their operating efficiency. Diffusion of impurities from the layer B into the silicon substrate 1 is also suppressed, making it possible to reduce the leakage current at the junctions provided in the silicon substrate 1. Further, since the layer B is densified by heat treatment in an oxidizing atmosphere before the conductor layer 6a (a polysilicon layer) is exposed by polishing the silicon nitride film 51 and the layer B, no boundary is formed in the layer B, and thus the buried structure has a preferable configuration in the trench.

Figure 33:
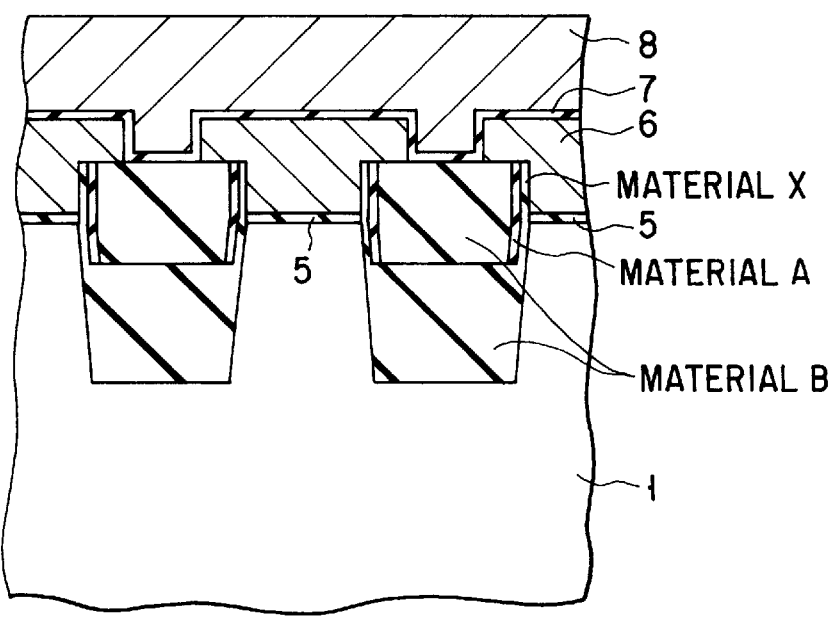
FIG. 33 is a sectional view of a NAND-type EEPROM according to an eighth embodiment of the invention.

FIG. 33 is a sectional view of a NAND-type EEPROM according to the eighth embodiment of the invention. The structure of the floating gate is similar to that of the embodiment shown in FIG. 27. That part of the eighth embodiment near the gate insulting films 5 is similar to the corresponding part of the first embodiment shown in FIG. 2. As seen from FIG. 33, layers A are deposited on silicon oxide films X, which are in turn formed on the sides of each floating gate 6. Layers A may be deposited directly on the sides of each floating gate 6. A layer B fills the gap between the two layers A provided on the opposing sides of two adjacent oxide films X. Thus, each layer A is interposed between the layers B and the oxide film X, which contacts the gate insulating film 5 and floating gate electrode 6. Hence, the impurities in the layer B cannot diffuse into the oxide film 5 unless they pass through the layer A. The layer A is, for example, silicon nitride layer in which the impurities in the material B diffuse only in a small amount. Hence, the impurities hardly diffuse into the gate insulating films 5. This prevents the memory cells from being deteriorated in their operating efficiency. Further, the impurities in the layer B diffuse into those parts of the silicon substrate 1 which are near the channels, but at a lower rate than in the conventional device being manufactured. Therefore, the leakage current can be reduced at the junctions provided in the silicon substrate 1.

A method of manufacturing the memory cells of the NAND-type EEPROM according to the eighth embodiment will be described, with reference to FIGS. 34 to 38.

Figure 34:
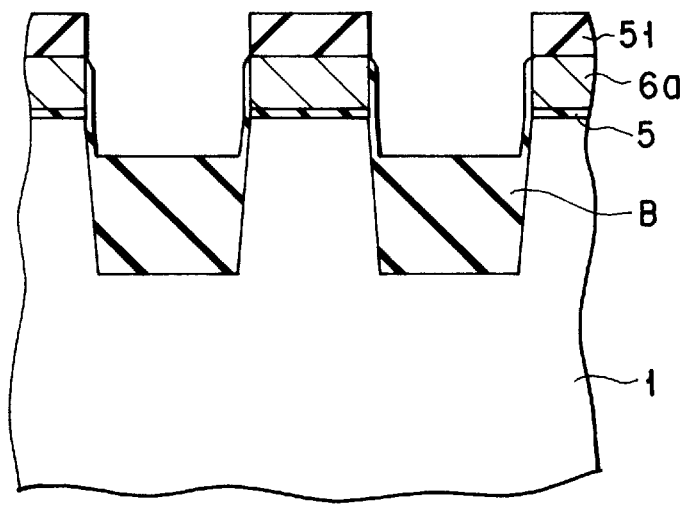
FIG. 34 is a sectional view explaining a first step of manufacturing the NAND-type EEPROM shown in FIG. 33.

First, as shown in FIG. 34, an oxide film 5 is formed on a silicon substrate 1. A conductor layer 6a, for example a polysilicon film, is formed on the oxide film 5. The conductor layer 6 will be processed to form floating gates. Further, a silicon nitride film 51, which will be processed to form a mask, is formed on the conductor layer 6. A resist is coated on the silicon nitride film 51 and subjected to patterning, forming a resist pattern (not shown). Using the resist pattern as a mask, the silicon nitride film 51, polysilicon film 6a and oxide film 5 are sequentially etched, exposing parts of the silicon substrate 1. The parts of the substrate 1, thus exposed, are etched, whereby trenches are made in the surface of the silicon substrate 1. The resist pattern is removed.

Thermal oxidation is performed, oxidizing the inner surfaces of each trench and forming a silicon oxide film X. Further, a layer B of, for example, TEOS is deposited, filling the trenches. The upper surface of the resultant structure is polished, setting the top of the layer B in each trench at a level a little below gate insulating films 5 and the upper surface of the silicon substrate 1.

Figure 35:
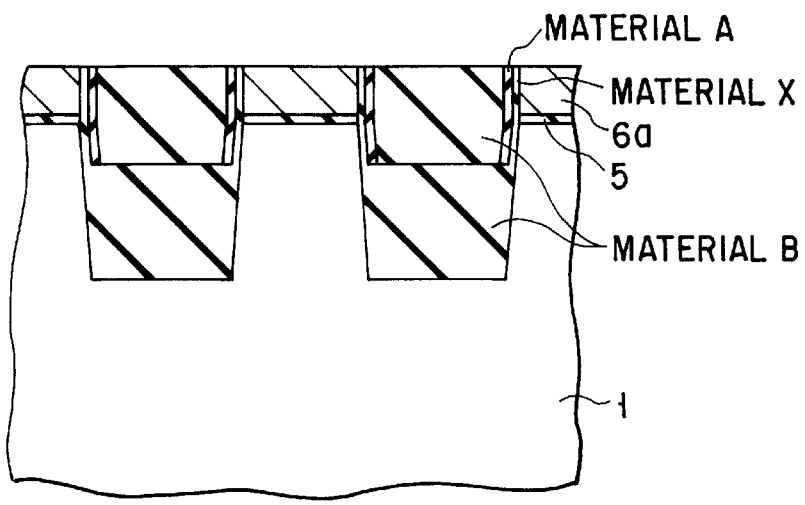
FIG. 35 is a sectional view explaining a second step of manufacturing the NAND-type EEPROM shown in FIG. 33.

A layer A of, for example, silicon nitride is deposited in the trenches. The layer A is etched back, leaving layers A on only the sides of the gate insulating film 5 and polysilicon film 6a which are provided in each trench, as is illustrated in FIG. 35. Another layer B is deposited on the surface of the resultant structure. The top of the structure is polished so that the top of the structure becomes flat, and the polysilicon films 6a (i.e., floating gates) are exposed.

Figure 36:
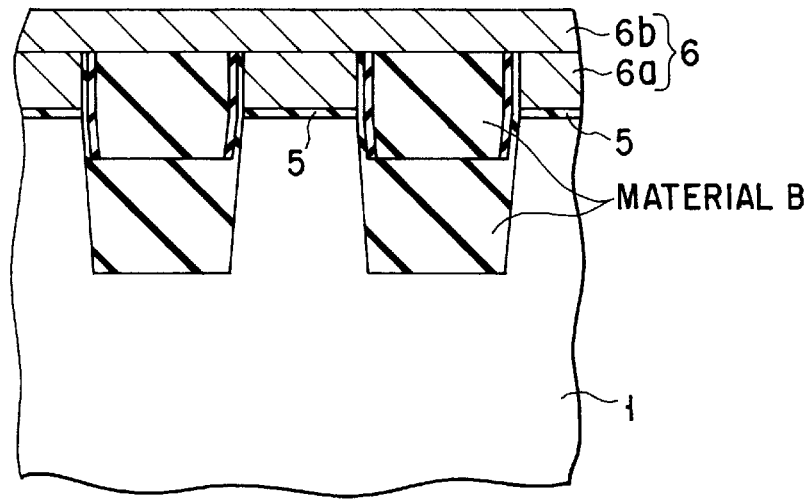
FIG. 36 is a sectional view explaining a third step of manufacturing the NAND-type EEPROM shown in FIG. 33.

As shown in FIG. 36, a conductor layer 6b, for example, a polysilicon layer, is formed on the flat upper surface of the structure. (The conductor layer 6b will be processed to form parts of floating gates.) The layer 6b covers the polysilicon films 6a already formed.

Figure 37:
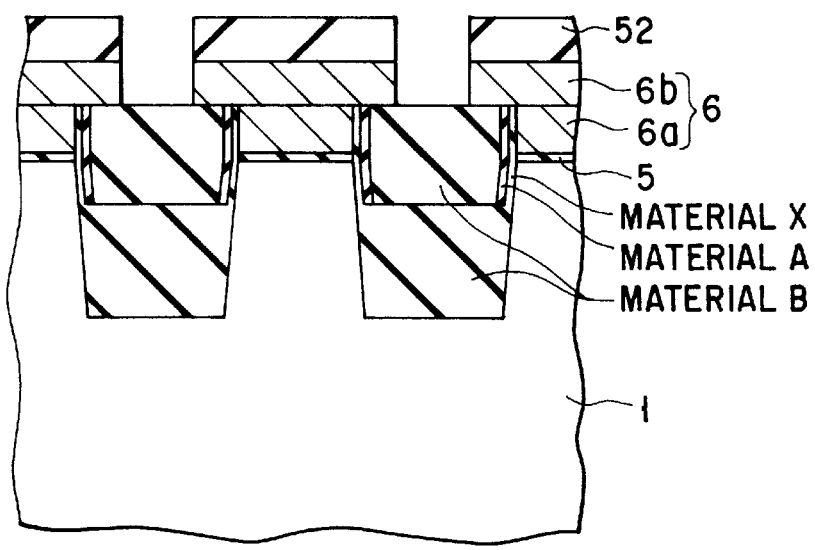
FIG. 37 is a sectional view explaining a fourth step of manufacturing the NAND-type EEPROM shown in FIG. 33.

Next, a silicon nitride film is formed on the upper surface of the resultant structure. The film is patterned to form a mask 52 having slits, as illustrated in FIG. 37. With the mask 2, the conductor layer 6b is patterned to have slits therebetween.

Figure 38:
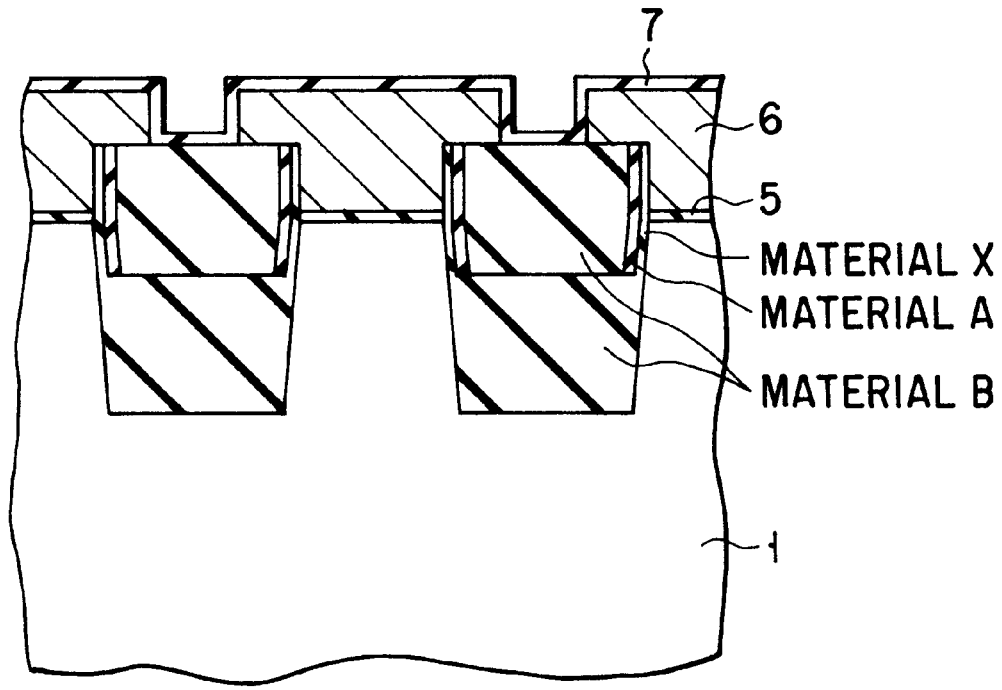
FIG. 38 is a sectional view explaining a fifth step of manufacturing the NAND-type EEPROM shown in FIG. 33.
Figure 39:
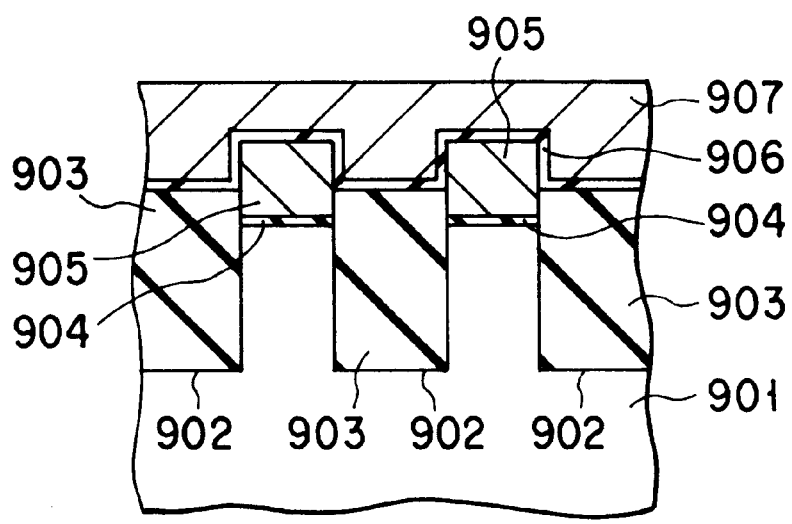
FIG. 39 is a sectional view showing the memory cells of a nonvolatile semiconductor memory having a conventional buried element-isolating structure.
Figure 40A:
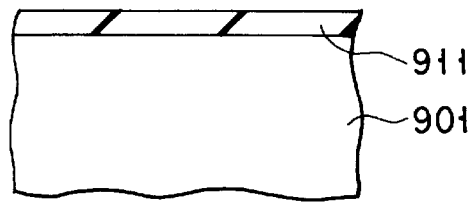
FIGS. 40A to 40E are sectional views, explaining a method of manufacturing the memory cells shown in FIG. 39.
Figure 40B:
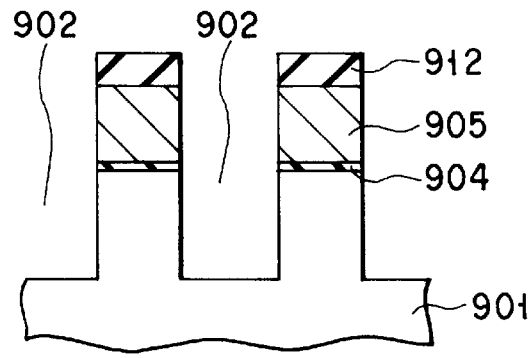
Figure 40C:
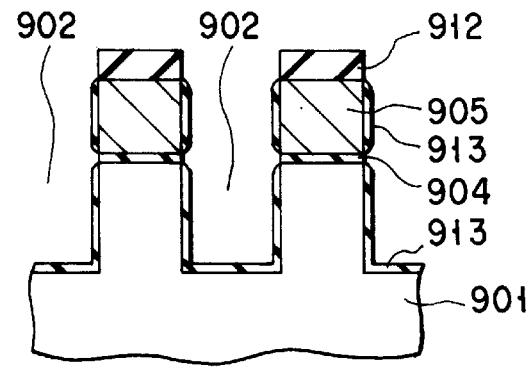
Figure 40D:
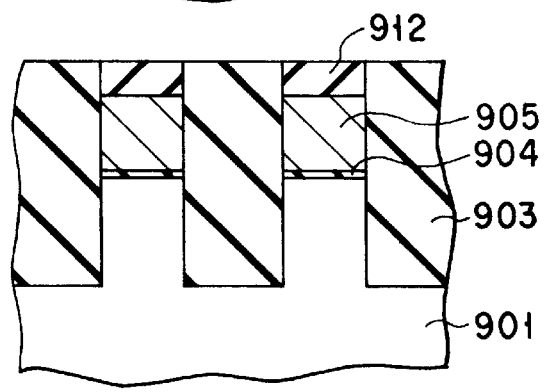
Figure 40E:
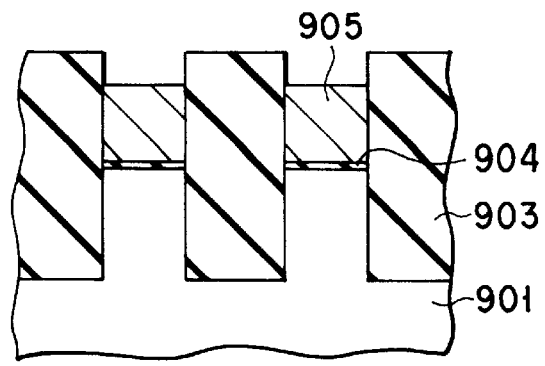

As shown in FIG. 38, the silicon nitride film 52 is removed. Further, an inter-layer insulating (ONO) film 7 is formed. Thereafter, as shown in FIG. 33, a second conductor layer 8 is formed on the insulating film 7. The second conductor layer 8 is, for example, a polysilicon layer, which will be processed to provide control gates. As a result, the memory cells of the NAND-type EEPROM, shown in FIG. 33, are manufactured.

The seventh embodiment shown in FIG. 33 has the same advantages as the third embodiment. That is, diffusion of the impurities from any layer B into the gate insulating films 5 and the like is suppressed since a dense layer A of, for example, silicon nitride is interposed between the layer B on one hand and the film 5 and the polysilicon film 6a (i.e., floating gate) on the other hand. Hence, the memory cells are prevented from being deteriorated in their operating efficiency.

As has been described, in the present invention, an insulating film buried in each trench is composed of two parts made of two different materials, respectively. The first material is of the type which forms a barrier to diffusion of impurities. The second material is of any other type. Composed of two parts of such different materials, the insulating film in the trench suppresses diffusion of impurities into the gate insulating film, gate electrode and substrate. Further, the layers B, each protecting the inner surfaces of each trench, prevent the silicon substrate from oxidized excessively, because they are made of material resistant to oxidation. Still further, the layers B can be reliably densified in an oxidizing atmosphere, filling up the trenches, forming no void in the trenches. Moreover, once the layers B are so densified, their etching rate decreases.

Thus, the present invention can provide a semiconductor device of high reliability and a method of manufacturing the same.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A semiconductor device comprising:

a semiconductor substrate;

a gate insulating film provided on an upper surface of the semiconductor substrate;

a gate electrode provided on an upper surface of the gate insulating film;

a trench provided in the semiconductor substrate;

a periphery insulating film provided on peripheral portions of the gate insulating film, the gate electrode, and the semiconductor substrate; and a plurality of element-isolating insulators buried in the trench, in which one of the element-isolating insulators is provided on a portion of the periphery insulating film, which portion corresponds to the gate insulating film, an interface between the gate insulating film and the gate electrode, and an interface between the gate insulating film and the semiconductor substrate, and in which said one element-isolating insulator is made of a material different from that of another of the element-isolating insulators.

2. A semiconductor device according to claim 1, wherein said semiconductor substrate is a silicon substrate, the periphery insulating film is a thermal oxide film, said one element, isolating insulator constitutes a first material insulator made of a first material and opposes via the thermal oxide film the gate insulating film, the interface between the gate insulating film and the gate electrode, and the interface between the gate insulating film and the semiconductor substrate, and said another element-isolating insulator constitutes a second material insulator made of a second material different from the first material of the first material insulator.

3. A semiconductor device according to claim 2, wherein said first material insulator is provided to correspond to the entire surface of the trench via the thermal oxide film, and said second material insulator opposes the semiconductor substrate via said first material insulator.

4. A semiconductor device according to claim 2, wherein said first material insulator is provided to correspond to the gate insulating film and the gate electrode and the substrate which are near the gate insulating film via the thermal oxide film, and said second material insulator opposes the gate insulating film and the gate electrode via at least said first material insulator.

5. A semiconductor device according to claim 2, wherein said second material insulator is located at a lower part of the trench, and said first material insulator is located at an upper part of the trench and opposes the gate insulating film.

6. A semiconductor device according to claim 2, wherein said first material insulator is resistant to oxidation.

7. A semiconductor device according to claim 2, wherein said first material insulator is a barrier material to impurities existing in said second material insulator.

8. A semiconductor device according to claim 2, wherein said first material insulator is silicon nitride and said second material insulator is silicon oxide.

9. A semiconductor device according to claim 2, wherein said first material insulator is oxynitride, and said second material insulator is silicon oxide.

10. A semiconductor device comprising:
    a semiconductor substrate;
    a plurality of trenches provided in the semiconductor substrate;
    an array including a plurality of elements, each of the elements being located among the trenches, each of the elements having a gate insulating film provided on an upper surface of the gate insulating film, and a periphery insulating film provided on peripheral portions of the gate insulating film, the gate electrode and the semiconductor substrate; and
    a plurality of element-isolating insulators buried in each of the trenches, in which one of the element-isolating insulators is provided on a portion of the periphery insulating film, which portion corresponds to the gate insulating film, an interface between the gate insulating film and the gate electrode, and an interface between the gate insulating film and the semiconductor substrate, and in which said one element-isolating insulator is made of a material different from that of another of the element-isolating insulators.

11. A semiconductor device according to claim 10, wherein said semiconductor substrate is a silicon substrate, the periphery insulating film is a thermal oxide film, said one element-isolating insulator constitutes a first material insulator made of a first material and opposes via the thermal oxide film the gate insulating film, the interface between the gate insulating film and the gate electrode, and the interface between the gate insulating film and the semiconductor substrate, and said another element-isolating insulator constitutes a second material insulator made of a second material different from the first material of the first material insulator.

12. A semiconductor device according to claim 11, wherein said first material insulator is provided to correspond to the entire surface of the trench via the thermal oxide film, and said second material insulator opposes the semiconductor substrate via said first material insulator.

13. A semiconductor device according to claim 11, wherein said first material insulator is provided to correspond to the gate insulating film and the gate electrode and the substrate which are near the gate insulating film via the thermal oxide film, and said second material insulator opposes the gate insulating film and the gate electrode via at least said first material insulator.

14. A semiconductor device according to claim 11, wherein said second material insulator is located at a lower part of the trench, and said first material insulator is located at an upper part of the trench and opposes the gate insulating film.

15. A semiconductor device according to claim 11, wherein said first material insulator is resistant to oxidation.

16. A semiconductor device according to claim 11, wherein said first material insulator is a barrier material to impurities existing in said second material insulator.

17. A semiconductor device according to claim 11, wherein said first material insulator is silicon nitride and said second material insulator is silicon oxide.

18. A semiconductor device according to claim 11, wherein said first material insulator is oxynitride, and said second material insulator is silicon oxide.

19. A semiconductor device according to claim 10, wherein said array of elements is an array of memory cells of a nonvolatile semiconductor memory, and the gate electrode is a floating gate electrode of the nonvolatile semiconductor memory.

* * * * *